(12) United States Patent
Nemoto et al.

(10) Patent No.: US 8,766,413 B2
(45) Date of Patent: Jul. 1, 2014

(54) SEMICONDUCTOR DEVICE AND METHOD FOR MANUFACTURING SEMICONDUCTOR DEVICE

(75) Inventors: Michio Nemoto, Nagano (JP); Takashi Yoshimura, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 233 days.

(21) Appl. No.: 13/505,294

(22) PCT Filed: Nov. 2, 2010

(86) PCT No.: PCT/JP2010/069528
§ 371 (c)(1),
(2), (4) Date: Jul. 9, 2012

(87) PCT Pub. No.: WO2011/052787
PCT Pub. Date: May 5, 2011

(65) Prior Publication Data
US 2012/0267681 A1 Oct. 25, 2012

(30) Foreign Application Priority Data

Nov. 2, 2009 (JP) ................................. 2009-251944

(51) Int. Cl.
*H01L 29/167* (2006.01)
*H01L 29/207* (2006.01)
*H01L 29/227* (2006.01)
*H01L 29/36* (2006.01)

(52) U.S. Cl.
USPC ............ 257/655; 257/656; 257/657; 257/139

(58) Field of Classification Search
USPC ......................................... 257/655–657, 139
See application file for complete search history.

(56) References Cited

U.S. PATENT DOCUMENTS

| 5,717,244 | A | 2/1998 | Soejima |
| 7,728,409 | B2 * | 6/2010 | Nemoto ........................ 257/656 |
| 2002/0130331 | A1 | 9/2002 | Nemoto et al. |
| 2002/0190281 | A1 | 12/2002 | Francis et al. |
| 2004/0041225 | A1 | 3/2004 | Nemoto |

(Continued)

FOREIGN PATENT DOCUMENTS

| JP | 58-216473 A | 12/1983 |
| JP | 08-125200 A | 5/1996 |

(Continued)

OTHER PUBLICATIONS

International Search Report for corresponding PCT/JP2010/069528, mail date Feb. 1, 2011.

*Primary Examiner* — Thien F Tran
(74) *Attorney, Agent, or Firm* — Rossi, Kimms & McDowell LLP

(57) ABSTRACT

A p anode layer (2) is formed on one main surface of an n⁻ drift layer (1). An n⁺ cathode layer (3) having an impurity concentration more than that of the n⁻ drift layer (1) is formed on the other main surface of the n⁻ drift layer (1). An anode electrode (4) is formed on the surface of the p anode layer (2). A cathode electrode (5) is formed on the surface of the n⁺ cathode layer (3). An n-type broad buffer region (6) that has a net doping concentration more than the bulk impurity concentration of a wafer and less than that of the n⁺ cathode layer (3) and the p anode layer (2) is formed in the n⁻ drift layer (1). The resistivity $\rho_0$ of the n⁻ drift layer (1) satisfies $0.12V_0 \le \rho_0 \le 0.25V_0$ with respect to a rated voltage $V_0$. The total amount of the net doping concentration of the broad buffer region (6) is equal to or more than $4.8 \times 10^{11}$ atoms/cm² and equal to or less than $1.0 \times 10^{12}$ atoms/cm².

20 Claims, 14 Drawing Sheets

(56) References Cited

U.S. PATENT DOCUMENTS

| | | | |
|---|---|---|---|
| 2005/0059263 A1 | 3/2005 | Nakazawa et al. | |
| 2006/0081923 A1 | 4/2006 | Mauder et al. | |
| 2007/0108558 A1 | 5/2007 | Nemoto | |
| 2008/0315364 A1 | 12/2008 | Nemoto | |
| 2009/0184340 A1 | 7/2009 | Nemoto et al. | |
| 2009/0224284 A1 | 9/2009 | Nemoto | |

FOREIGN PATENT DOCUMENTS

| | | | |
|---|---|---|---|
| JP | 2000-223720 A | 8/2000 |
| JP | 2003-152198 A | 5/2003 |
| JP | 2003-318412 A | 11/2003 |
| JP | 2004-039842 A | 2/2004 |
| JP | 2005-223301 A | 8/2005 |
| JP | 2007-158320 A | 6/2007 |
| JP | 2007-266233 A | 10/2007 |
| JP | 2008-091853 A | 4/2008 |
| JP | 2009-176892 A | 8/2009 |
| JP | 2009-188336 A | 8/2009 |
| WO | 2007055352 A1 | 5/2007 |
| WO | 2007085387 A1 | 8/2007 |

\* cited by examiner

SEMICONDUCTOR DEVICE AND METHOD FOR MANUFACTURING SEMICONDUCTOR DEVICE

TECHNICAL FIELD

The present invention relates to a semiconductor device, such as a diode or an Insulated Gate Bipolar Transistor (IGBT), which operates at a high speed and has low loss and soft recovery characteristics, and a method for manufacturing a semiconductor device.

BACKGROUND ART

Power semiconductor devices are used in power converting devices, such as converters and inverters with high efficiency and low power consumption, and are indispensable for controls of rotary motors or servo motors. The power control device requires the characteristics of low loss, low power consumption, a high-speed operation, high efficiency, and no environmental problem, that is, no adverse influence on the surroundings. In order to meet the demand for a power control device with low loss and high efficiency, a diode with a broad buffer structure has been proposed as an improved type of the diode used in the power control device. The broad buffer structure means a structure in which the impurity concentration distribution of an n⁻ drift layer has a peak (local maximum value) in the vicinity of a center portion of the n⁻ drift layer and which has a broad buffer region including a region in which the impurity concentration distribution is inclined so as to be reduced toward an anode and a cathode.

The diode with the broad buffer structure allows a reduction in the emitter injection efficiency of the related art and realization of soft recovery characteristics and an oscillation prevention effect in a high-speed operation (for example, carrier frequency: 5 kHz or more) which has been difficult to be achieved in the lifetime distribution control technique.

A method using a hydrogen-induced donor has been proposed as a method of manufacturing the diode with the broad buffer structure. In the method, an floating zone (FZ) bulk wafer is irradiated with protons (hydrogen ions, H⁺) such that the protons H⁺ reach the depth of the n⁻ drift layer which has been hardly achieved by a general n-type doping element (phosphorus or arsenic) ion injection method, thereby forming a lattice defect, and a heat treatment is then performed. In the method, the irradiation with the protons and the heat treatment cause a donor (for example, called a hydrogen-induced donor or a hydrogen-associated donor) to be formed in the vicinity of the range Rp of the proton H⁺ in the wafer by a defect complex including the proton H⁺ (for example, see the following Patent Literature 1 (Paragraphs 0020 and 0021) and the following Patent Literature 2 (Abstract)). In addition, a method has been proposed in which oxygen is introduced into a wafer and is combined with the hydrogen-induced donor, thereby forming a high-concentration broad buffer region (for example, see the following Patent Literature 3 (Paragraph 0011)).

In general, a silicon (Si) power semiconductor, an FZ wafer which is cheaper than an epitaxial wafer is used to manufacture an IGBT or a diode from an economic viewpoint. In addition, it is known that a method which irradiates a silicon wafer with neutron beams to convert silicon into phosphorus (P), which is a stable isotope, using nuclear transmutation, thereby forming phosphorus, which is an impurity, in a wafer (hereinafter, referred to as a neutron irradiation wafer) is effective in uniformly distributing impurities in the wafer. The resistivity variation of the neutron irradiation wafer, for example, a 6-inch wafer is about ±8%.

As a method of forming the neutron irradiation wafer, a method has been proposed which changes protons H⁺ into donors using irradiation with the protons H⁺ and a heat treatment and injects donors with a concentration more than that of the wafer before neutron irradiation into the n base region (n⁻ drift layer) (for example, see the following Patent Literature 4).

CITATION LIST

Patent Literature

Patent Literature 1: Japanese Patent Application Laid-Open (JP-A) No. 2003-318412
Patent Literature 2: International Publication Pamphlet No. WO2007/055352
Patent Literature 3: JP-A No. 2007-266233
Patent Literature 4: JP-A No. 2008-91853

DISCLOSURE OF INVENTION

Problem to be Solved by the Invention

However, in the FZ wafer according to the related art into which an impurity element mixed with a raw material gas is introduced (gas-doped) by ion injection or thermal diffusion, a resistivity variation is more than that of the neutron irradiation wafer and is about ±12% in a 6-inch wafer. The large resistivity variation directly affects a breakdown voltage variation. Therefore, it is necessary to newly examine a reduction in the breakdown voltage variation. In the case of a semiconductor device with a non-punch through structure, the breakdown voltage $V_B$ (V) of the semiconductor device can be represented by the following Expression 1.

$$V_B = W^2/(0.29\rho_0) \quad \text{[Expression 1]}$$

In Expression 1, W is the width (μm) of a depletion layer and $\rho_0$ is the resistivity (bulk resistivity) of a silicon wafer. In the above-mentioned Expression 1, for example, in the semiconductor device with the non-punch through structure which is manufactured using the gas-doped FZ wafer, when a variation in the resistivity $\rho_0$ is ±12%, a variation in the breakdown voltage $V_B$ is also 12%. In addition to the breakdown voltage, a variation in the switching characteristics is also 12%. When the variation in the switching characteristics is 12% or more, a problem is likely to occur in warranty on the operation of the device. One of the methods of reducing the variation in the switching characteristics to 12% or less is to reduce the resistivity variation to be less than ±12%. For example, as described above, in order to reduce the resistivity variation, it is effective to use the neutron irradiation wafer whose resistivity is controlled by neutron irradiation which reduces the resistivity variation to be less than ±12%.

However, when the bulk resistivity is adjusted by neutron irradiation, an atomic furnace is needed and a huge cost is required to build and maintain the atomic furnace. Therefore, it is not economically practical for one semiconductor manufacturing company to possess the atomic furnace. It is necessary to request an external institution having the atomic furnace to adjust the bulk resistivity. However, there are few external institutions including foreign institutions. There is an increasing demand for in-vehicle or industrial power semiconductors and it is difficult for only the external institutions to process the power semiconductors. In addition, the processing cost is high. Therefore, it is desirable to find a method capable of reliably reducing or solving the variation in the breakdown voltage of the semiconductor device or the variation in the switching characteristics at a low cost, as a method other than the method using the neutron irradiation.

When the semiconductor device is manufactured using the gas-doped FZ wafer, without using the neutron irradiation wafer, a variation in the resistivity of the wafer increases as the diameter of the wafer becomes more than 6 inches. Therefore, it is technically difficult to reduce the resistivity variation to be less than ±12%. In addition, when a Czochralski (CZ) wafer is used to manufacture a semiconductor device, it is difficult to manufacture an n-type wafer which is originally uniform and has high resistivity. Therefore, it is difficult to reduce the resistivity variation to be less than ±12% using the CZ wafer. Therefore, it is desirable to provide a semiconductor device with a new device structure which has a small effect on the breakdown voltage variation even when the resistivity variation of the FZ wafer is equal to or more than ±12% as described above and a method of manufacturing the semiconductor device.

As a method of removing the breakdown voltage variation, Patent Literature 3 discloses a method which introduces protons using ion implantation and performs a heat treatment at 500° C. so that the protons diffuse into the entire n⁻ drift layer, thereby controlling the impurity concentration of the n⁻ drift layer. However, in practice, since data indicating that the hydrogen-associated donor is removed at a temperature of 550° C. or more has been obtained, it is difficult to control impurity concentration in a wide range, such as the entire n⁻ drift layer. In particular, it is very difficult to control the impurity concentration of a low-concentration n⁻ drift layer required for a semiconductor device with a high breakdown voltage. Therefore, when the semiconductor device with a high breakdown voltage is manufactured, it is difficult to obtain the effect of reducing a variation in the breakdown voltage even when the technique disclosed in Patent Literature 3 is applied.

The invention has been made in order to solve the above-mentioned problems, and an object of the invention is to provide a semiconductor device capable of reducing a variation in a breakdown voltage and a variation in switching characteristics and a method of manufacturing a semiconductor device. In addition, an object of the invention is to provide a semiconductor device capable of reducing manufacturing costs and a method of manufacturing a semiconductor device.

Means for Solving Problem

In order to solve the above-mentioned problems and achieve the objects of the invention, according to an aspect of the invention, there is provided a semiconductor device including: a first first-conductivity-type semiconductor layer; a second second-conductivity-type semiconductor layer that is provided on one main surface of the first semiconductor layer and has an impurity concentration more than that of the first semiconductor layer; a third first-conductivity-type semiconductor layer that is provided on the other main surface of the first semiconductor layer and has an impurity concentration more than that of the first semiconductor layer; and a first-conductivity-type broad buffer region which is provided in the first semiconductor layer and has an impurity concentration more than that of the first semiconductor layer and in which a local maximum value of an impurity concentration distribution is less than the impurity concentration of the second semiconductor layer and the third semiconductor layer. The total amount of the net doping concentration of the broad buffer region is equal to or more than $4.8 \times 10^{11}$ atoms/cm² and equal to or less than $1.0 \times 10^{12}$ atoms/cm². The resistivity $\rho_0$ (Ωcm) of the first semiconductor satisfies $0.12V_0 \leq \rho_0 \leq 0.25V_0$ with respect to a rated voltage $V_0$ (V).

The total amount of the net doping concentration of the broad buffer region may be equal to or more than $5.2 \times 10^{11}$ atoms/cm² and equal to or less than $1.0 \times 10^{12}$ atoms/cm², and the resistivity $\rho_0$ of the first semiconductor layer may satisfy $0.133V_0 \leq \rho_0 \leq 0.25V_0$ with respect to the rated voltage $V_0$ (V).

A plurality of broad buffer regions may be provided in the first semiconductor layer.

A ratio $\gamma$ of the sum of the widths of the plurality of broad buffer regions to the width of the first semiconductor layer, a ratio $\eta$ of the sum of reductions in the electric field intensities of the plurality of broad buffer regions to a critical electric field intensity when an reverse-bias voltage with the same level as a breakdown voltage is applied, and a deviation ratio a of a measured value to a standard value of the donor concentration of a substrate which will be the first semiconductor layer may satisfy $4\alpha(\gamma/\eta)/\{(2-\alpha)(2+\alpha)\} < \alpha$.

The first semiconductor layer may be an FZ silicon substrate.

In order to solve the above-mentioned problems and achieve the objects of the invention, according to another aspect of the invention, there is provided a semiconductor device including: a first-conductivity-type drift layer; a second-conductivity-type base layer that is provided on a first main surface of the drift layer and has an impurity concentration more than that of the drift layer; a first-conductivity-type emitter layer that is provided on the first main surface of the drift layer so as to come into contact with the base layer and has an impurity concentration more than that of the base layer; an insulating film that comes into contact with the drift layer, the base layer, and the emitter layer; a gate electrode that is adjacent to the drift layer, the base layer, and the emitter layer through the insulating film; a second-conductivity-type collector layer that is provided on a second main surface of the drift layer and has an impurity concentration more than that of the drift layer; and a first-conductivity-type broad buffer region which is provided in the drift layer and has an impurity concentration more than that of the drift layer and in which a local maximum value of an impurity concentration distribution is less than the impurity concentration of the base layer and the collector layer. The total amount of the net doping concentration of the broad buffer region is equal to or more than $4.8 \times 10^{11}$ atoms/cm² and equal to or less than $1.0 \times 10^{12}$ atoms/cm², and the resistivity $\rho_0$ (Ωcm) of the drift layer satisfies $0.12V_0 \leq \rho_0 \leq 0.25V_0$ with respect to a rated voltage $V_0$ (V).

The total amount of the net doping concentration of the broad buffer region may be equal to or more than $5.2 \times 10^{11}$ atoms/cm² and equal to or less than $1.0 \times 10^{12}$ atoms/cm², and the resistivity $\rho_0$ (Ωcm) of the drift layer may satisfy $0.133V_0 \leq \rho_0 0.25V_0$ with respect to the rated voltage $V_0$ (V).

A plurality of broad buffer regions may be provided in the drift layer.

A ratio $\gamma$ of the sum of the widths of the plurality of broad buffer regions to the width of the drift layer, a ratio $\eta$ of the sum of reductions in the electric field intensities of the plurality of broad buffer regions to a critical electric field intensity when an reverse-bias voltage with the same level as a breakdown voltage is applied, and a deviation ratio a of a measured value to a standard value of the donor concentration of a substrate which will be the drift layer may satisfy $4\alpha(\gamma/\eta)/\{(2-\alpha)(2+\alpha)\} < \alpha$.

The semiconductor device according to the above-mentioned aspect may further include a first-conductivity-type field stop layer that comes into contact with the drift layer or the broad buffer region on the first main surface of the substrate and comes into contact with the collector layer on the second main surface.

The semiconductor device according to the above-mentioned aspect may further include a first-conductivity-type field stop layer that comes into contact with the drift layer or the broad buffer region on the first main surface side of the substrate and comes into contact with the collector layer on the second main surface. The total amount of the net doping concentration of the drift layer, the broad buffer region, and the field stop layer may be equal to or more than $1.2 \times 10^{12}$ atoms/cm² and equal to or less than $2.0 \times 10^{12}$ atoms/cm².

The drift layer may be an FZ silicon substrate.

In order to solve the above-mentioned problems and achieve the objects of the invention, according to still another aspect of the invention, there is provided a method of manufacturing a semiconductor device including a first first-conductivity-type semiconductor layer, a second second-conductivity-type semiconductor layer that is provided on one main surface of the first semiconductor layer and has an impurity concentration more than that of the first semiconductor layer, a third first-conductivity-type semiconductor layer that is provided on the other main surface of the first semiconductor layer and has an impurity concentration more than that of the first semiconductor layer, and a first-conductivity-type broad buffer region which is provided in the first semiconductor layer interposed between the second semiconductor layer and the third semiconductor layer and has an impurity concentration more than that of the first semiconductor layer and in which a local maximum value of an impurity concentration distribution is less than the impurity concentration of the second semiconductor layer and the third semiconductor layer. The method includes: a first forming step of forming the second semiconductor layer on the one main surface of the first semiconductor layer; and a second forming step of irradiating the second semiconductor layer on the first semiconductor layer with a hydrogen ion at a projected range to the first semiconductor layer and performing a heat treatment at a temperature of 300° C. or more to 550° C. or less, thereby forming the broad buffer region in the first semiconductor layer. In the second forming step, the broad buffer region having a total net doping concentration of $4.8 \times 10^{11}$ atoms/cm² or more to $1.0 \times 10^{12}$ atoms/cm² or less is formed in the first semiconductor layer, and the resistivity $\rho_0$ of the first semiconductor layer satisfies $0.12V_0 \leq \rho_0 \leq 0.25V_0$ with respect to a rated voltage $V_0$ (V).

The method of manufacturing a semiconductor device according to the above-mentioned aspect may further include an introducing step of performing a heat treatment at a temperature of 1000° C. or more in an oxidizing atmosphere to introduce oxygen into the first semiconductor layer before the first forming step.

In the introducing step, the oxygen may be introduced at a concentration of $1 \times 10^{16}$ atoms/cm³ or more into the first semiconductor layer.

In order to solve the above-mentioned problems and achieve the objects of the invention, according to yet another aspect of the invention, there is provided a method of manufacturing a semiconductor device including a first first-conductivity-type semiconductor layer, a second second-conductivity-type semiconductor layer that is provided on one main surface of the first semiconductor layer and has an impurity concentration more than that of the first semiconductor layer, a third first-conductivity-type semiconductor layer that is provided on the other main surface of the first semiconductor layer and has an impurity concentration more than that of the first semiconductor layer, and a first-conductivity-type broad buffer region which is provided in the first semiconductor layer and has an impurity concentration more than that of the first semiconductor layer and in which a local maximum value of an impurity concentration distribution is less than the impurity concentration of the second semiconductor layer and the third semiconductor layer. The method includes a second forming step of irradiating the other main surface of the first semiconductor layer with a hydrogen ion at a projected range to a portion of the first semiconductor layer deeper than a position where the third semiconductor will be formed by a subsequent step and performing a heat treatment at a temperature of 300° C. or more to 550° C. or less, thereby forming the broad buffer region in the first semiconductor layer. In the second forming step, the broad buffer region having a total net doping concentration of $4.8 \times 10^{11}$ atoms/cm² or more to $1.0 \times 10^{12}$ atoms/cm² or less is formed in the first semiconductor layer, and the resistivity $\rho_0$ of the first semiconductor layer satisfies $0.12V_0 \leq \rho_0 \leq 0.25V_0$ with respect to a rated voltage $V_0$ (V).

The method of manufacturing a semiconductor device according to the above-mentioned aspect may further include an introducing step of performing a heat treatment at a temperature of 1000° C. or more in an oxidizing atmosphere to introduce oxygen into the first semiconductor layer before the first forming step.

In the introducing step, the oxygen may be introduced at a concentration of $1 \times 10^{16}$ atoms/cm³ or more into the first semiconductor layer.

In the second forming step, a hydrogen-induced donor may be formed by the irradiation with the hydrogen ion, thereby forming the broad buffer region.

The first semiconductor layer may be an FZ silicon substrate.

According to the invention, the broad buffer region is provided in the first semiconductor layer (drift layer) with the resistivity $\rho_0$ (Ωcm) which satisfies $0.12V_0 \leq \rho_0 \leq 0.25V_0$ with respect to the rated voltage $V_0$ (V). The total amount of the net doping concentration of the broad buffer region is equal to or more than $4.8 \times 10^{11}$ atoms/cm² and equal to or less than $1.0 \times 10^{12}$ atoms/cm². In this way, even when a variation in the resistivity of the first semiconductor layer is about ±12%, it is possible to reduce the range in which the breakdown voltage of the semiconductor device is changed according to the variation in the resistivity of the first semiconductor layer. In addition, it is possible to reduce the range in which the switching characteristics of the semiconductor device are changed according to the variation in the resistivity of the first semiconductor layer.

In addition, when a plurality of broad buffer regions are formed in the drift layer, the expansion of a space charge region during switching can be finely controlled.

After the second semiconductor layer (anode/base layer) is formed on one main surface of the first semiconductor layer, the one main surface or the other main surface of the first semiconductor layer is irradiated with hydrogen ions at a projected range to a portion deeper than the second semiconductor layer or the third semiconductor layer (cathode/collector layer) which is formed in the subsequent process and a heat treatment is performed at a temperature of 300° C. or more to 550° C. or less. In this way, the broad buffer region can be formed in the first semiconductor layer (drift layer) under the above-mentioned conditions. In this case, the resistivity $\rho_0$ (Ωcm) of the first semiconductor layer satisfies the above-mentioned conditions with respect to the rated voltage $V_0$ (V). In this way, even when a variation in the resistivity of the first semiconductor layer is about ±12%, it is possible to reduce the range in which the breakdown voltage of the semiconductor device is changed according to the variation in the resistivity of the first semiconductor layer. In addition, it is possible to reduce the range in which the switching characteristics of the semiconductor device are changed according to the variation in the resistivity of the first semiconductor layer.

In addition, a reduction in the mobility of electrons and holes in the broad buffer region can be prevented when the substrate is irradiated with the hydrogen ions in the second forming step.

In the invention, a semiconductor device with a broad buffer structure can be manufactured at a low cost, using an FZ wafer.

Effect of the Invention

According to the invention, the effect of reducing a variation in a breakdown voltage and a variation in switching characteristics can be obtained. In addition, the effect of reducing manufacturing costs can be obtained.

BEST MODES FOR CARRYING OUT THE INVENTION

Hereinafter, a semiconductor device and a method of manufacturing the same according to exemplary embodiments of the invention will be described in detail with reference to the accompanying drawings. The invention is not limited to the following embodiments as long as it does not depart from the scope of the invention. In the following description, one conductivity type is an n type and the other conductivity type is a p type. However, the same effect is obtained even though the types are reversed.

First Embodiment

A diode in which a silicon wafer is irradiated with proton ions ($H^+$) and a broad buffer structure is formed in an $n^-$ drift layer in order to control the impurity concentration of the $n^-$ drift layer in the silicon wafer and a method of manufacturing the diode will be described below.

Figure 1:
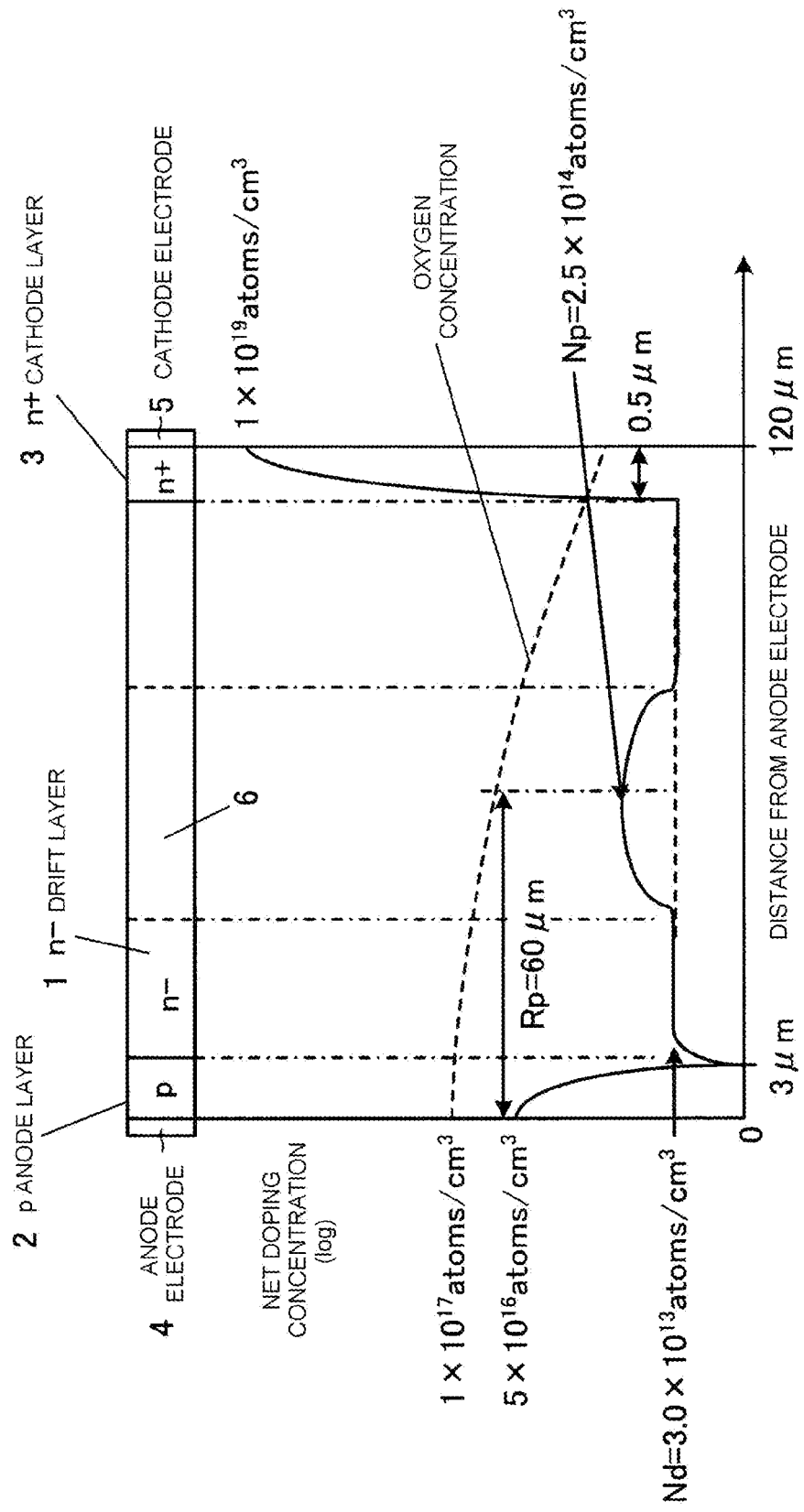
FIG. 1 is a diagram illustrating the structure of a semiconductor device and a net doping concentration distribution according to a first embodiment.

FIG. 1 is a diagram illustrating the structure of a semiconductor device and a net doping concentration distribution according to a first embodiment. As illustrated in the cross-sectional view (the upper side of the plane of paper) of the semiconductor device in FIG. 1, the diode according to the first embodiment is formed on an n-type semiconductor substrate (wafer). The bulk resistivity of the wafer is $\rho_0$ ($\Omega$cm). A p anode layer 2 is formed on one main surface of the wafer. An $n^+$ cathode layer 3 is formed on the other main surface of the wafer. A portion (first semiconductor layer) of the semiconductor substrate interposed between the p anode layer 2 (second semiconductor layer) and the $n^+$ cathode layer 3 (third semiconductor layer) is an $n^-$ drift layer 1. An anode electrode 4 is formed on the surface of the p anode layer 2. A cathode electrode 5 is formed on the surface of the $n^+$ cathode layer 3.

In FIG. 1, as illustrated in a characteristic diagram illustrating the relation between the distance from the anode electrode 4 and the net doping concentration (log) (the lower side of the plane of paper), the net doping concentration of the $n^-$ drift layer 1 has a mountain-shaped profile in which it is a peak in the vicinity of the middle of the $n^-$ drift layer 1 and is reduced with a certain gradient toward the p anode layer 2 and the $n^+$ cathode layer 3, and there is a mound-shaped region in which is the net-doping concentration is higher than that of the $n^-$ drift layer 1. The n-type mound-shaped region is referred to as a broad buffer region 6. The local maximum value of the impurity concentration distribution of the broad buffer region 6 is less than the impurity concentration of the n+ cathode layer 3 and the p anode layer 2. That is, the broad buffer region 6 is provided in the $n^-$ drift layer 1, and has a net doping concentration that is more than the bulk impurity concentration of the wafer and is less than the impurity concentration of the $n^+$ cathode layer 3 and the p anode layer 2.

The structure of the diode according to the invention has the following two important points: the bulk resistivity $\rho_0$ ($\Omega$cm) of the semiconductor substrate (wafer) satisfies the following Expression 2 with respect to the rated voltage $V_0$ (V) of the diode; and the effective dose (the total amount of the net doping concentration of the same layer) of the broad buffer region 6 is equal to or more than $4.8 \times 10^{11}$ atoms/cm$^2$ and equal to or less than $1.0 \times 10^{12}$ atoms/cm$^2$.

$$0.12V_0 \leq \rho_0 \leq 0.25V_0 \quad \text{[Expression 2]}$$

Figure 2:
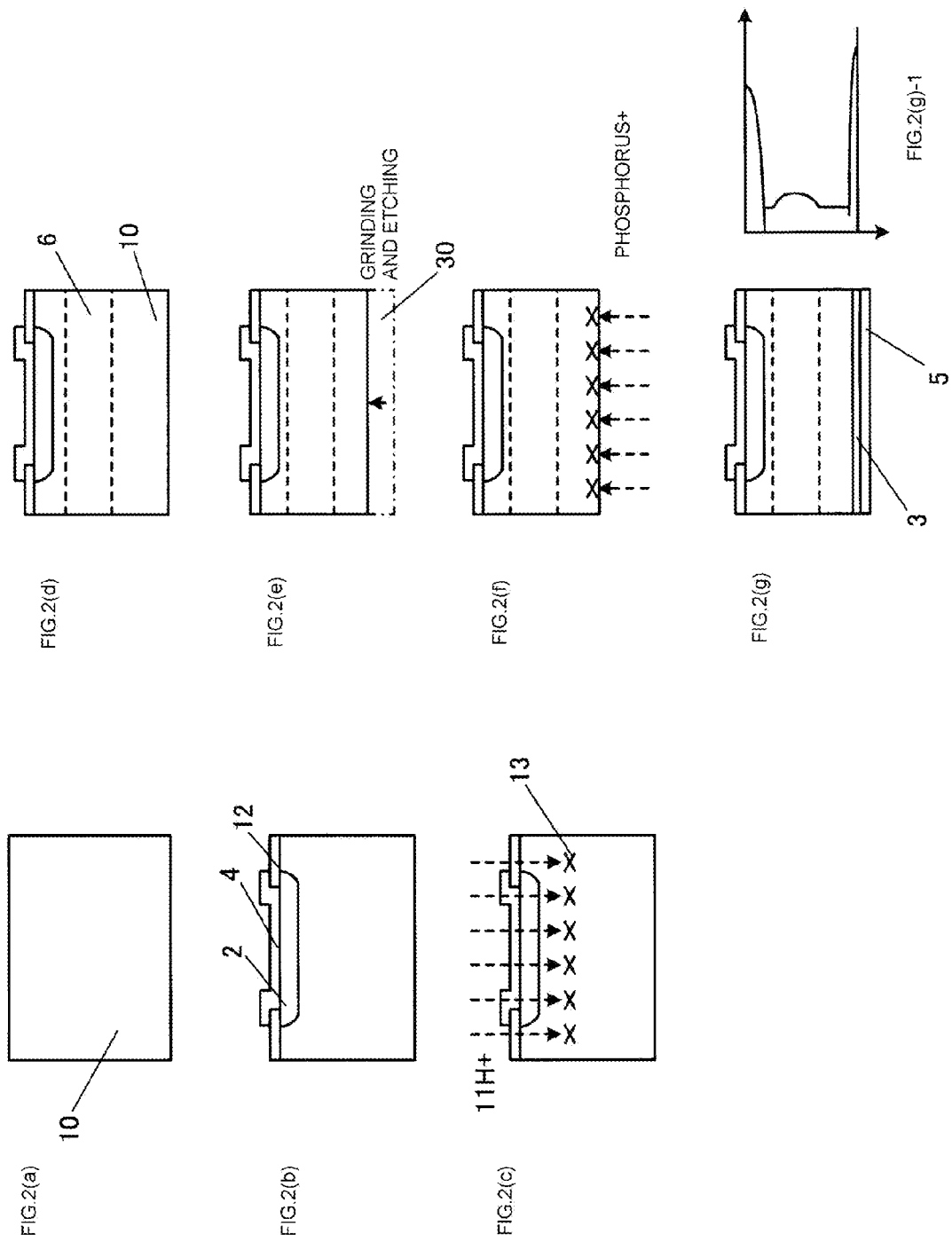
FIG. 2 is a diagram illustrating a process of manufacturing the semiconductor device according to the first embodiment.
Figure 3:
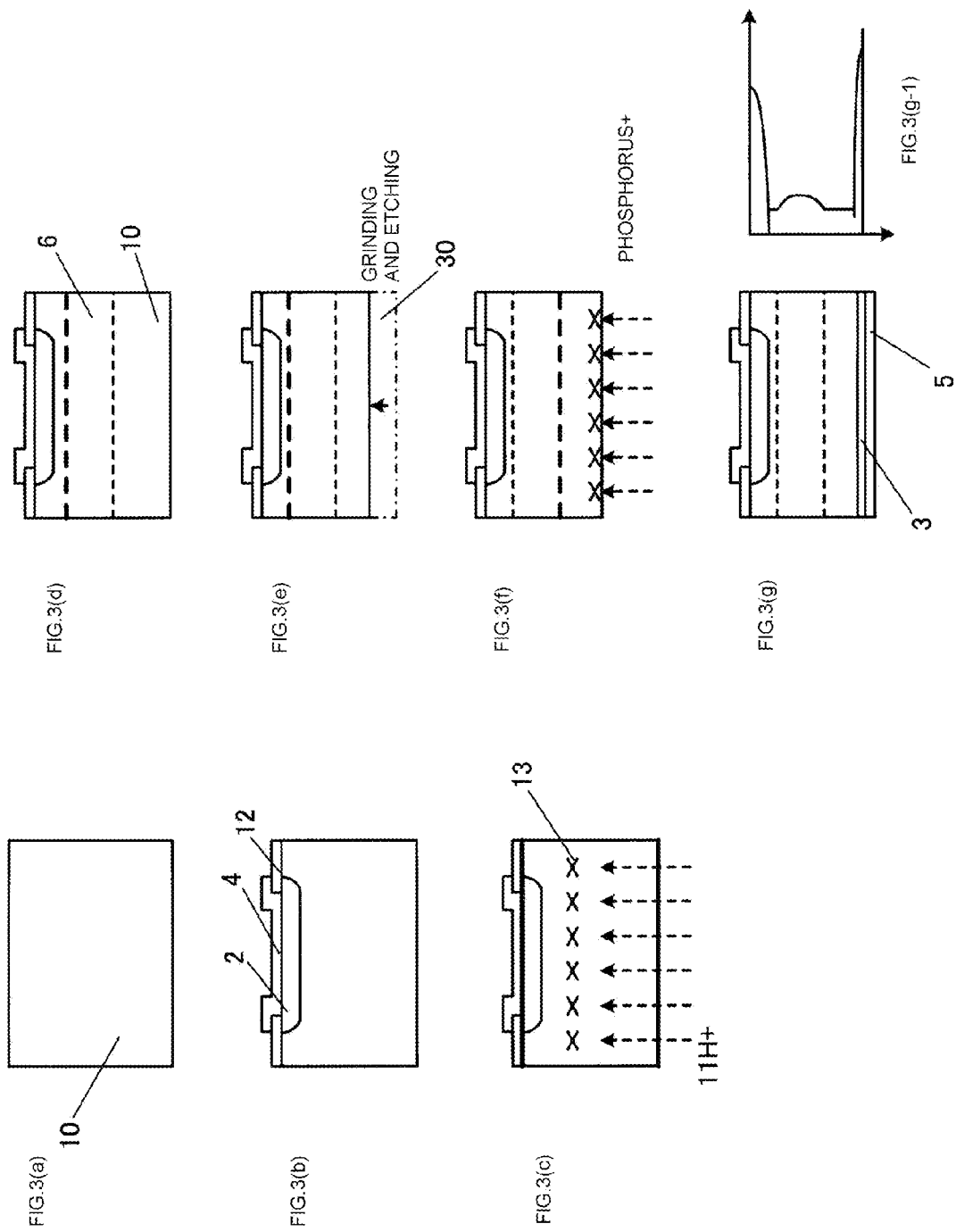
FIG. 3 is a diagram illustrating the process of manufacturing the semiconductor device according to the first embodiment.

FIGS. 2 and 3 are diagrams illustrating a process of manufacturing the semiconductor device according to the first embodiment. The broad buffer region 6 may be formed by performing irradiation with protons $H^+$ 11 (see FIGS. 2(c) and 3(c)) and a heat treatment on the wafer including the p anode layer 2 and the anode electrode 4 formed on one main surface thereof from the anode electrode 4. Next, the process of manufacturing the semiconductor device according to the first embodiment will be described in detail with reference to FIGS. 2 and 3. In this embodiment, for example, a case in which the diode (rated voltage: $V_0$=1200 V; and rated current: 150 A) with the dimensions and net doping concentration illustrated in FIG. 1 is manufactured will be described.

FIGS. 2(a) to 2(g) sequentially illustrated the main manufacturing processes of the diode. First, as a wafer (semiconductor substrate), an FZ wafer 10 with a resistivity of 144 Ωcm to 300 Ωcm, for example, 150 Ωcm (phosphorus concentration: $2.0 \times 10^{13}$ atoms/cm$^3$) and a thickness of about 500 μm is prepared. The FZ wafer 10 is used as the first semiconductor layer. Hereinafter, the impurity concentration of the FZ wafer 10 is referred to as bulk concentration and the resistivity thereof is referred to as bulk resistivity (FIG. 2(a)). The relation between the resistivity ρ (Ωcm) and donor concentration N (atoms/cm$^3$) is represented by $\rho = 4.596 \times 10^{15}/N$ when the resistivity is more than 1 Ωcm.

Then, a standard diode manufacturing process is performed to form the p anode layer 2 which will be the second semiconductor layer, a edge termination structure portion including a guard ring (not illustrated), an insulating film 12, and the anode electrode 4 on one main surface of the FZ wafer 10. The impurity concentration of the p anode layer 2 is, for example, $5 \times 10^{16}$ atoms/cm$^3$ and the junction depth thereof from the surface is, for example, 3 μm. In addition, the anode electrode 4 is made of an aluminum alloy (hereinafter, referred to as Al—Si (1%)), such as aluminum silicon (AlSi) including about 1 wt % of silicon (FIG. 2(b)).

Then, the surface of the anode electrode 4 is irradiated with a proton H$^+$ 11 accelerated by a cyclotron. At that time, the acceleration voltage of the cyclotron is, for example, 7.9 MeV, and the dose of the proton H$^+$ 11 is, for example, $2.0 \times 10^{12}$ atoms/cm$^2$. In addition, an aluminum absorber (not illustrated) is used and the thickness of the aluminum absorber is adjusted to irradiate the FZ wafer 10 with the proton H$^+$ 11 through the aluminum absorber such that the range of the proton H$^+$ 11 from the surface of the FZ wafer 10 is 60 μm. In FIG. 2(c), a crystal defect 13 occurring in the FZ wafer due to the irradiation with the proton H$^+$ 11 is represented by X (FIG. 2(c)).

Then, for example, a heat treatment is performed at 350° C. for 1 hour in a nitrogen atmosphere (which may include hydrogen) to recover the crystal defect 13. In this way, an n-type high-concentration region is formed so as to be spread to about ±20 μm from a depth of 60 μm from the surface of the wafer. The high-concentration region is the broad buffer region 6 (within two dashed lines) (FIG. 2(d)).

Then, grinding and wet etching 30 is performed on the other main surface (the rear surface of the FZ wafer 10) of the FZ wafer 10 such that the FZ wafer 10 has a desired thickness. In this stage, the thickness of the FZ wafer 10 is typically in the range of 100 μm to 160 μm when the rated voltage $V_0$ is 1200 V. In the first embodiment, in this stage, the thickness of the FZ wafer 10 is 120 μm (FIG. 2(e)).

Then, n-type impurity ions, such as phosphorus ions, are injected into the surface (rear surface) of the FZ wafer 10 subjected to the grinding and wet etching 30. In this case, the acceleration voltage is, for example, 50 keV, and the dose of phosphorus is, for example, $1 \times 10^{15}$ atoms/cm$^2$ (impurity concentration; $1 \times 10^{19}$ atoms/cm$^3$) (FIG. 2(f)). Then, for example, a YAG second harmonic laser emits a laser beam to the ion-injected surface using a double pulse method. The injected n-type impurity ions, such as the injected phosphorus ions, are electrically activated by the laser irradiation and a third semiconductor layer which will be the n+ cathode layer 3 is formed (FIG. 2(g)).

The double pulse method continuously radiates a plurality of pulsed laser beams whose irradiation timings deviate from each other by a predetermined delay time from a plurality of laser irradiation devices to each laser beam irradiation area. The double pulse method is disclosed in JP-A-2005-223301. When the laser beams are radiated by the double pulse method, the total energy density for each laser beam irradiation area is, for example, 3 J/cm$^2$. In addition, the double pulse delay time is, for example, 300 nsec.

Finally, metal materials are deposited on the surface of the n+ cathode layer 3 in the order of aluminum, titanium, nickel, and gold to form the cathode electrode 5 which comes into ohmic contact with the surface of the n$^+$ cathode layer 3. In this way, the diode is completed. A portion of the semiconductor substrate between the p anode layer 2 and the n$^+$ cathode layer 3 in the FZ wafer 10 is the n$^-$ drift layer 1. A characteristic diagram (g-1) illustrated on the right side of FIG. 2(g) is a net doping concentration profile corresponding to the cross-sectional view of the diode illustrated in FIG. 2(g).

In addition, it is preferable to add the following manufacturing processes before the diode manufacturing process starts. First, although not illustrated in the drawings, phospho-silicate glass is applied onto the FZ wafer 10 illustrated in FIG. 2(a) and phosphorus and oxygen are diffused and introduced from both surfaces of the wafer by a drive-in process at 1300° C. for 10 hours. Then, the phosphorus-diffused layer on one main surface of the wafer is scraped away and then mirror-polished. Then, oxygen is introduced with a maximum dose of $1 \times 10^{18}$ atoms/cm$^3$ corresponding to solid solubility at 1300° C. only into the other main surface (for example, the rear surface) of the wafer, thereby forming a wafer in which the impurity concentration of the phosphorus-diffused layer (surface concentration: $1 \times 10^{20}$ atoms/cm$^3$; and depth; about 80 μm) is more than the concentration of the wafer. Then, the diode manufacturing process (process after FIG. 2(b)) is performed using the wafer. The reason why it is preferable to add the above-mentioned process is as follows. As disclosed in Patent Literature 3, the phosphorus-diffused layer which is formed on the rear surface of the wafer and has an impurity concentration more than the concentration of the wafer acts as a layer for gettering impurities, such as heavy metal, and the concentration of oxygen from the surface of the anode layer to the peak (hereinafter, referred to as peak concentration) of the net doping concentration of the broad buffer region (that is, the range Rp of the proton H$^+$) increases, which allows prevention of a reduction in the mobility of electrons and holes in the broad buffer region due to irradiation with the proton H$^+$ 11.

When a wafer including a low concentration of oxygen, such as the FZ wafer using polycrystalline silicon as a raw material, is used, a drive-in process or a thermal oxidation process may be performed at a temperature of 1000° C. or more in an atmosphere including oxygen. The reason is that oxygen is infiltrated and diffused in the silicon substrate by the heat treatment and the oxygen concentration of the wafer increases. In this case, oxygen is distributed at a concentration of $1 \times 10^{16}$ atoms/cm$^3$ or more to $1 \times 10^{17}$ atoms/cm$^3$ or less, which is a sufficiently high impurity concentration to be detected by Secondary Ion Mass Spectrometry (SIMS) measurement, and the same effect as that of preventing a reduction in the mobility of electrons and holes in the broad buffer region can be obtained. The oxygen concentration may be equal to or more than $1 \times 10^{18}$ atoms/cm$^3$ by a heat treatment at a temperature of 1300° C. or more. However, when the oxygen concentration is more than the above-mentioned value, an oxygen deposit or an oxygen-induced defect is likely to be generated. Therefore, it is preferable that oxygen concentration be equal to or less than $1 \times 10^{18}$ atoms/cm$^3$. That is, it is preferable that the oxygen concentration from the surface of the anode layer to the peak concentration of the broad buffer region (that is, the range Rp of the proton H$^+$) be equal to or more than $1\times10^{16}$ atoms/cm$^3$ and equal to or less than $1\times10^{18}$ atoms/cm$^3$.

In addition, a complex defect including holes formed when hydrogen is introduced into the wafer by the irradiation of the wafer with the proton H$^+$ is formed together with donors by the introduced oxygen in an active portion in which the main current flows in the semiconductor device as well as the edge termination structure portion. The phosphorus-diffused layer with impurity concentration more than the concentration of the n-type wafer is also formed immediately below the edge termination structure portion. As a result, the resistivity of the wafer increases, and the impurity concentration immediately below the edge termination structure portion increases, which results in an increase in the equipotential line density of a depletion layer which is spread when a reverse bias is applied to the main pn junction. In this way, it is possible to reduce the influence of the breakdown voltage by external charge through the insulating film on the surface of the edge termination structure portion. In addition, when defect density immediately below the edge termination structure portion increases, the lifetime of the vicinity thereof is reduced. Therefore, it is possible to prevent the concentration of a current or a residual carrier on the boundary between the active portion and the edge termination structure portion when power is turned on and during reverse recovery.

In addition to the hydrogen (H$^+$) ion, a lithium ion (Li$^+$) or an oxygen ion (O$^-$) is changed to the n-type donor by the radiated charged particle (ion). However, the lithium ion or the oxygen ion has a mass more than the hydrogen ion and it is difficult to obtain a sufficiently wide range with the same energy. Therefore, when ions need to be injected to a depth of about 60 μm from the surface of the wafer, the hydrogen ion (H$^+$) is most preferable.

Figure 4:
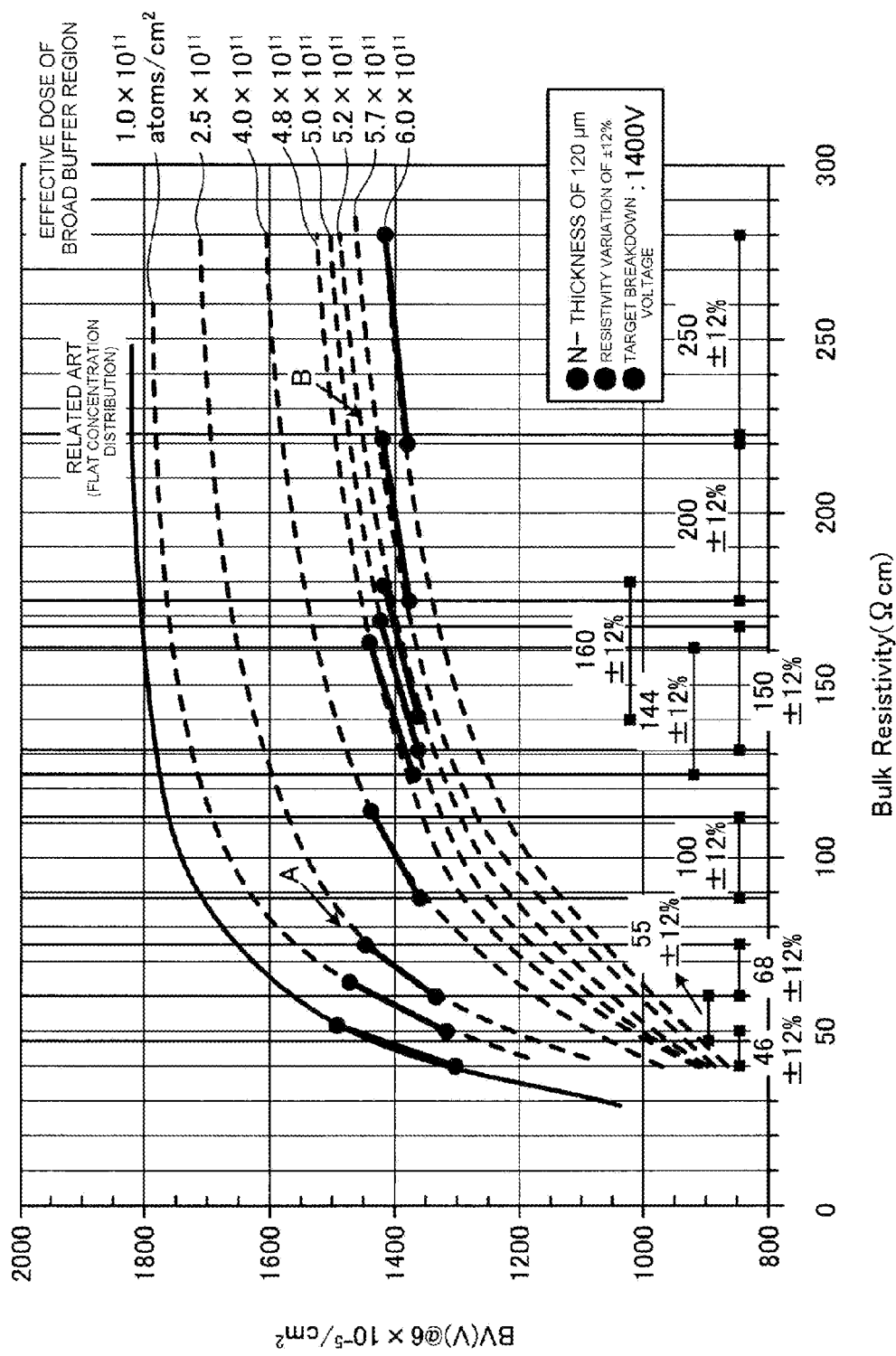
FIG. 4 is a characteristic diagram illustrating the relation between bulk resistivity and a breakdown voltage of the semiconductor device.
Figure 6:
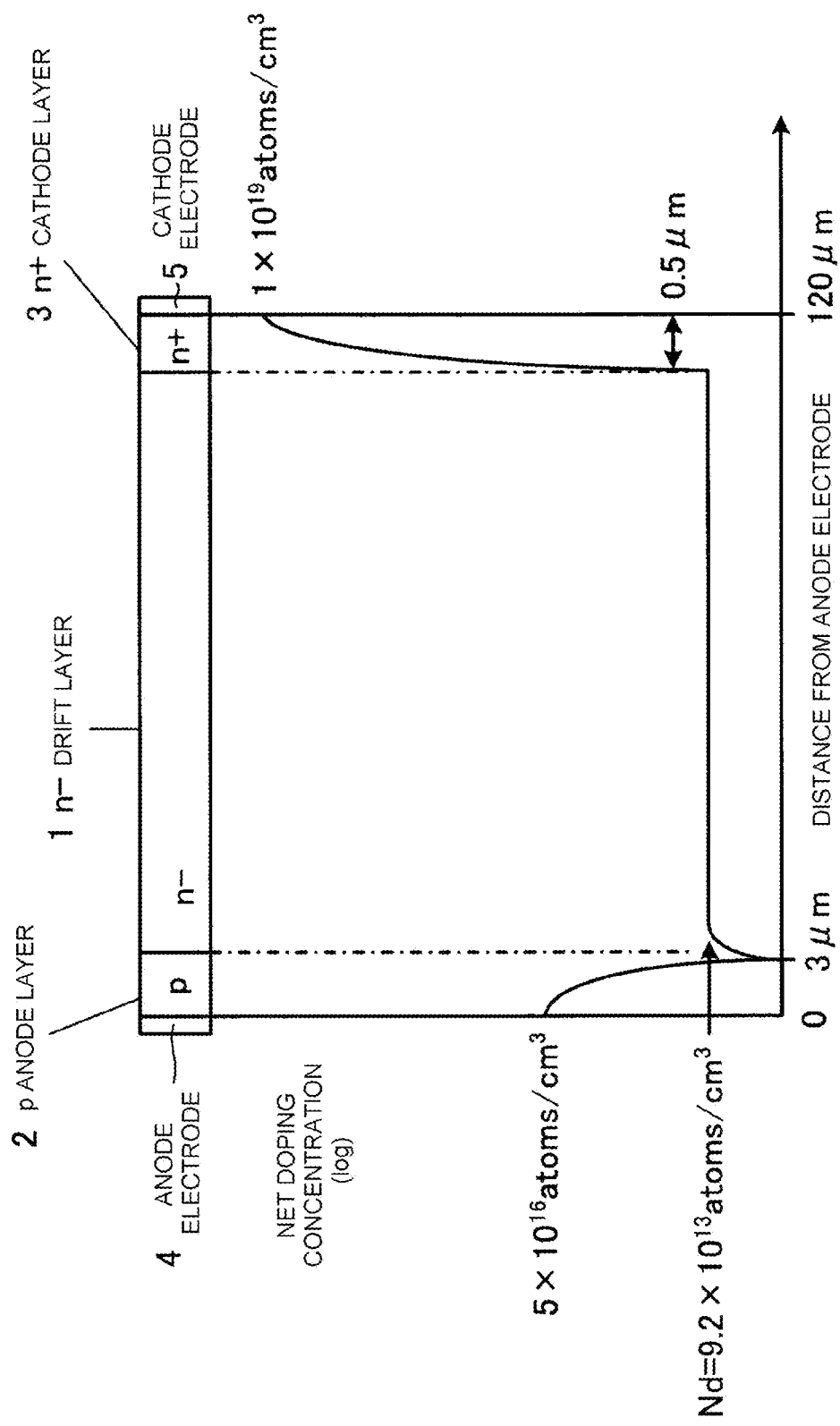
FIG. 6 is a diagram illustrating the structure of a semiconductor device and a net doping concentration distribution according to the related art.

FIG. 4 is a characteristic diagram illustrating the relation between the bulk resistivity and the breakdown voltage of the semiconductor device. FIG. 6 is a diagram illustrating the structure and net doping concentration distribution of a semiconductor device according to the related art. FIG. 4 illustrates the diode (the diode illustrated in the main part cross-sectional view of FIG. 1; hereinafter, referred to as an example) according to the invention in which the broad buffer region 6 is provided in the n$^-$ drift layer 1, a diode (first conventional example) according to the related art in which a broad buffer region is provided in the n$^-$ drift layer, and a diode (a diode illustrated in the main part cross-sectional view of FIG. 6 (hereinafter, referred to as a second conventional example)) including the n$^-$ drift layer 1 which does not include the broad buffer region and has a flat doping concentration distribution (which is described as a flat concentration distribution in FIG. 4) according to the related art. The diodes according to the first and second conventional examples are given as comparative examples. The thickness of the n$^-$ drift layer 1 is 120 μm (as illustrated in FIG. 1, strictly, the thickness of the n$^-$ drift layer 1 is 116.5 μm obtained by subtracting the thickness of the p anode layer 2 and the n+ cathode layer 3 from 120 μm. However, hereinafter, for convenience of explanation, the thickness of the n$^-$ drift layer 1 is described to be 120 μm).

For the diodes (according to the example and the first conventional example) in which the broad buffer region 6 is provided in the n$^-$ drift layer 1, a change in the breakdown voltage of the semiconductor device with respect to the resistivity (the horizontal axis) of the wafer (substrate) when the effective dose of the broad buffer region 6 is changed in various ways, that is, when the effective dose of the broad buffer region 6 is $1.0\times10^{11}$ atoms/cm$^2$, $2.5\times10^{11}$ atoms/cm$^2$, $4.0\times10^{11}$ atoms/cm$^2$, $4.8\times10^{11}$ atoms/cm$^2$, $5.0\times10^{11}$ atoms/cm$^2$, $5.2\times10^{11}$ atoms/cm$^2$, $5.7\times10^{11}$ atoms/cm$^2$, and $6.0\times10^{11}$ atoms/cm$^2$. In the example, the effective dose of the broad buffer region 6 is equal to or more than $4.8\times10^{11}$ atoms/cm$^2$. For the diode (second conventional example) according to the related art in which the n$^-$ drift layer 1 has a flat doping concentration distribution, when the resistivity of the wafer including the n$^-$ drift layer 1 with a thickness of 120 μm is changed, a breakdown voltage value is represented by a plot line with a name "flat concentration distribution according to the related art".

First, in the flat doping concentration distribution according to the related art, under the condition that the thickness of the n$^-$ drift layer is constant (120 μm), when the resistivity increases, the breakdown voltage increases and is converged on a constant value. In general, when devices are designed, the thickness of the n$^-$ drift layer and the resistivity are selected considering the balance among the breakdown voltage, loss when power is turned on, and switching characteristics. For example, the thickness of the n$^-$ drift layer is about $0.1V_0$ (μm) with respect to the rated voltage $V_0$ (V). In addition, the rated voltage $V_0$ (V) and the typical resistivity $\rho_0$ (Ωcm) of the substrate are empirically represented by the following Expression 3.

$$\rho_0 = 0.045 V_0 \qquad \text{[Expression 3]}$$

For example, the typical resistivity $\rho_0$ (Ωcm) of the substrate is about 27 Ωcm at a rated voltage $V_0$ of 600 V, about 54 Ωcm at a rated voltage $V_0$ of 1200 V, about 77 Ωcm at a rated voltage $V_0$ of 1700 V, about 149 Ωcm at a rated voltage $V_0$ of 3300 V, about 203 Ωcm at a rated voltage $V_0$ of 4500 V, and about 293 Ωcm at a rated voltage $V_0$ of 6500 V. In addition, the typical resistivity $\rho_0$ (Ωcm) of the substrate may be set to be 1.5 times more than the above-mentioned value, particularly, at a high rated voltage of 1700 V or more, considering an operational tolerance. In order to suppress a high overshoot voltage during switching, the typical resistivity $\rho_0$ (Ωcm) of the substrate may be reduced to 80% of the above-mentioned value.

At a rated voltage $V_0$ of 1200 V, the manufactured device has a high actual breakdown voltage with a margent of about 20% over the rated voltage. For example, the actual breakdown voltage is set to 1400 V at a rated voltage $V_0$ of 1200 V. In this case, as can be seen from FIG. 4, in the diode according to the related art which is represented by a flat concentration distribution, the resistivity of the substrate at which the actual breakdown voltage is 1400 V is 46 Ωcm. Similarly, as can be seen from FIG. 4, the resistivity values at which the actual breakdown voltage is 1400 V in the diodes in which the effective doses of the broad buffer region are $1\times10^{11}$ atoms/cm$^2$, $2.5\times10^{11}$ atoms/cm$^2$, $4\times10^{11}$ atoms/cm$^2$, $4.8\times10^{11}$ atoms/cm$^2$, $5.0\times10^{11}$ atoms/cm$^2$, $5.2\times10^{11}$ atoms/cm$^2$, $5.7\times10^{11}$ atoms/cm$^2$, and $6\times10^{11}$ atoms/cm$^2$ are 55 Ωcm, 68 Ωcm, 100 Ωcm, 144 Ωcm, 150 Ωcm, 160 Ωm, 200 Ωcm, and 250 Ωcm, respectively.

As illustrated in FIG. 4, the range (hereinafter, referred to as a resistivity variation range) of a variation in the resistivity of the wafer is strongly reflected to the range of a variation in the breakdown voltage of the semiconductor device, according to the resistivity of the wafer. That is, when the resistivity of the wafer varies within a given width range (hereinafter, referred to as a resistivity variation width), the resistivity variation width is directly connected with the width of a variation in the breakdown voltage of the semiconductor device (hereinafter, referred to as a breakdown voltage variation width). In the case of the second conventional example, for example, the resistivity at which the breakdown voltage is 1400 V is 46 Ωcm. In the range of about 30 Ωcm to about 80 Ωcm including the resistivity value of 46 Ωcm, the breakdown voltage value varies greatly. For example, when the resistivity variation is 46 Ωcm±12% (about 41 Ωcm to 52 Ωcm), the range of a variation in the breakdown voltage (hereinafter, referred to as a breakdown voltage variation range) corresponding to the resistivity variation range is from about 1290 V to about 1480 V. That is, the breakdown voltage variation range corresponds to a breakdown voltage variation width of about 13.7% with respect to a center value of 1385 V. The breakdown voltage variation width needs to be a small value required by the market, for example, 5% or less. Therefore, in order to satisfy the breakdown voltage variation width required by the market, the resistivity variation width needs to be further reduced. However, as described above, the range of the resistivity variation width of the FZ wafer with high resistivity (for example, 20 Ωcm or more) which is warranted by the wafer manufacturer is ±12% (variation width: 24%) or less in gas doping and is ±8% (variation width: 16%) or less in a neutron irradiation wafer. Even in the neutron irradiation wafer, the breakdown voltage variation width is significantly more than an allowable value.

In the first conventional example (the diode including the broad buffer structure according to the related art), in the case of a broad buffer diode with an effective dose of $2.5 \times 10^{11}$ atoms/cm², the resistivity at which the breakdown voltage is 1400 V (rated voltage $V_0$=1200 V) is about 68 Ωcm, as illustrated in FIG. 4 (see A in FIG. 4). When a variation in the resistivity is ±12%, the resistivity variation range is from about 60 Ωcm to 76 Ωcm. As can be seen from FIG. 4, the breakdown voltage variation range corresponding to the resistivity variation range of 60 Ωcm to 76 Ωcm is from 1320 V to 1460 V. The breakdown voltage variation range corresponds to a breakdown voltage variation width of about 10.1% with respect to a center value of 1390 V. The breakdown voltage variation width is less than a breakdown voltage variation width of 13.7% in the first conventional example, but is more than a breakdown voltage variation width of 5% required by the market. Therefore, the breakdown voltage variation width is not still enough. Similarly, in the case of a broad buffer diode with an effective dose of $4.0 \times 10^{11}$ atoms/cm², as can be seen from FIG. 4, the resistivity at which the breakdown voltage is 1400 V (rated voltage $V_0$=1200 V) is about 100 Ωcm. The breakdown voltage variation range corresponding to a resistivity variation of ±12% is from 1340 V to 1430 V and the breakdown voltage variation width is about 6.5%. Therefore, a breakdown voltage variation width of 5% or less which is required by the market is not satisfied yet.

On the other hand, in the example (the diode with the broad buffer structure according to the invention), in the case of the broad buffer diode in which the effective dose of the broad buffer region is $4.8 \times 10^{11}$ atoms/cm², as can be seen from FIG. 4 (see B in FIG. 4), the resistivity at which the breakdown voltage is 1400 V is 144 Ωcm. When a variation in the resistivity is 12%, the resistivity variation range is from 126.7 Ωcm to 161.3 Ωcm. The breakdown voltage variation range corresponding to the resistivity variation range is from 1363 V to 1425 V. That is, the breakdown voltage variation width is 4.4% with respect to a center value of 1394 V. In the broad buffer diodes in which the effective doses are $5.0 \times 10^{11}$ atoms/cm², $5.7 \times 10^{11}$ atoms/cm², and $6.0 \times 10^{11}$ atoms/cm², similarly, as can be seen from FIG. 4, the resistivity values corresponding to a breakdown voltage of 1400 V are 150 Ωcm, 200 Ωcm, and 250 Ωcm. When a variation in the resistivity is 12%, the resistivity variation ranges are from 132 Ωcm to 168 Ωcm, from 176 Ωcm to 114 Ωcm, and from 220 Ωcm to 280 Ωcm. The breakdown voltage variation ranges corresponding to the resistivity variation ranges are sequentially from 1371 V to 1431 V, from 1378 V to 1422 V, and from 1380 V to 1415 V. That is, the breakdown voltage variation widths are sequentially 4.3% with respect to a center value of 1401 V, 3.1% with respect to a center value of 1400 V, and 2.5% with respect to a center value of 1397 V. Therefore, the breakdown voltage variation width is reduced to the range of slightly more than 2% to slightly more than 4%. Therefore, in all of the examples, a breakdown voltage variation width of 5% required by the market is satisfied.

Figure 5:
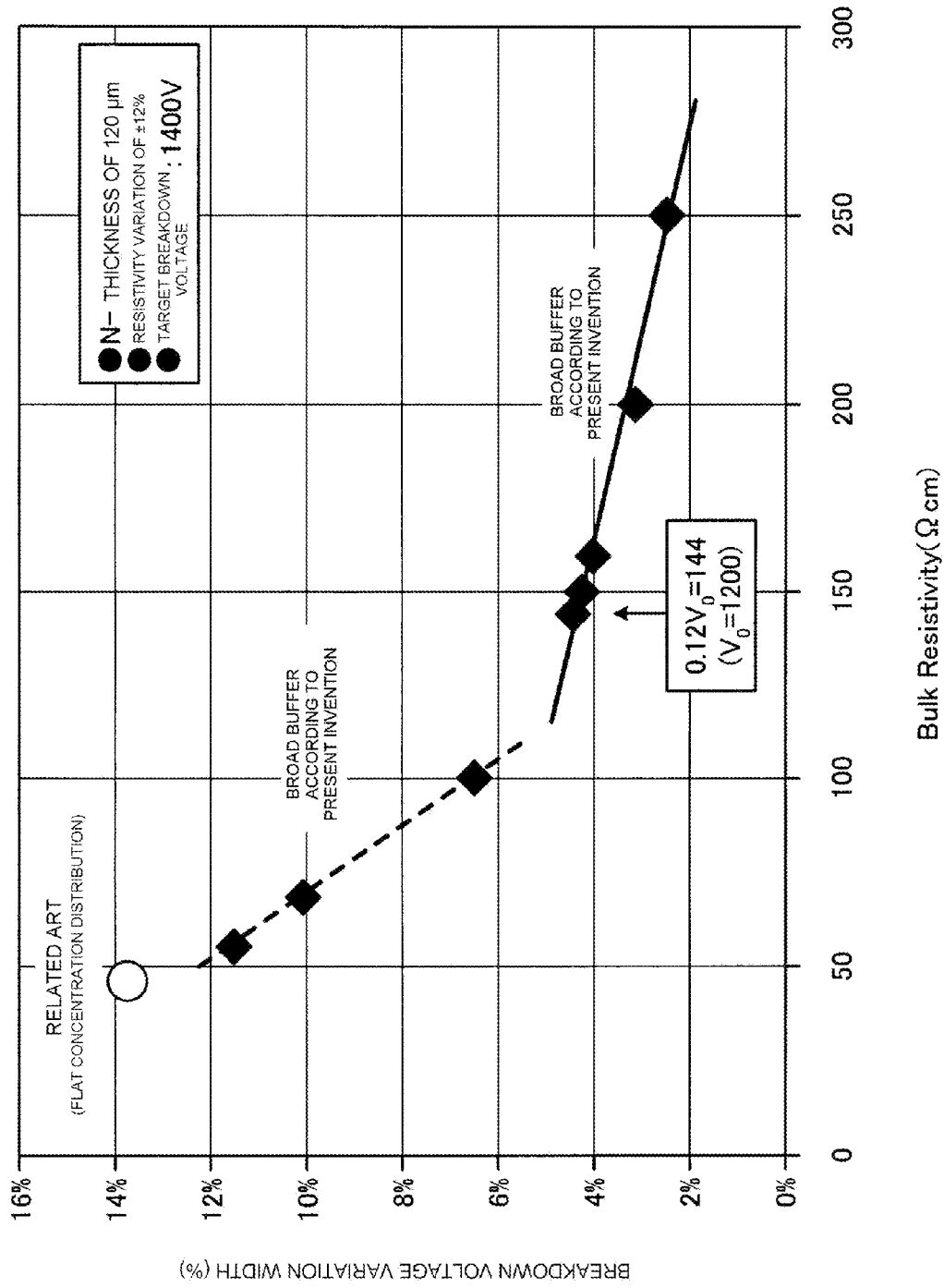
FIG. 5 is a characteristic diagram illustrating the relation between bulk resistivity and the width of a variation in the breakdown voltage of the semiconductor device.

FIG. 5 is a characteristic diagram illustrating the relation between the bulk resistivity and the breakdown voltage variation width of the semiconductor device. The relation between the bulk resistivity illustrated in FIG. 4 and the breakdown voltage variation width (%) of the semiconductor device is illustrated in FIG. 5. That is, as described with reference to FIG. 4, the effective dose of the broad buffer region is selected such that the actual breakdown voltage is 1400 V with respect to a given bulk resistivity value, and the breakdown voltage variation width (%) calculated from the breakdown voltage variation range when a variation in each bulk resistivity is 12% was plotted on the vertical axis (the horizontal axis indicates the bulk resistivity (Ωcm)).

In the diode (second conventional example) according to the related art which has a bulk resistivity of 46 Ωcm and does not include the broad buffer region, the breakdown voltage variation width is 13.7%, which is a large value, and the breakdown voltage variation width required by the market is not satisfied. Even in the structure in which the broad buffer region is provided in the drift layer (first conventional example), when the bulk resistivity is a small value of 55 Ωcm, 68 Ωcm, and 100 Ωcm, the breakdown voltage variation widths are about 11.5%, about 10.1%, and about 6.5%, which are more than 5.0%, and the breakdown voltage variation width required by the market is not satisfied. Therefore, this structure is not included in the invention. When the broad buffer region is provided in the drift layer, but the effective dose is too large, for example, the effective dose is more than $1.0 \times 10^{12}$ atoms/cm², the bulk resistivity corresponding to a breakdown voltage of 1400 V is more than 300 Ωcm. Therefore, this structure is not included in the invention. The reason will be described below.

In contrast, in the diode (example) according to the invention in which the broad buffer region is provided in the drift layer, the breakdown voltage variation width is 4.4% at a bulk resistivity of 144 Ωcm, 4.3% at a bulk resistivity of 150 Ωcm, 4.0% at a bulk resistivity of 160 Ωcm, 3.1% at a bulk resistivity of 200 Ωcm, and 2.5% at a bulk resistivity of 250 Ωcm. That is, the breakdown voltage variation width of the semiconductor device is reduced to 5.0% or less which is required by the market. As can be seen from FIG. 4, the effective doses of the broad buffer region corresponding to the bulk resistivities of 144 Ωcm, 150 Ωcm, 160 Ωcm, 200 Ωcm, and 250 Ωcm are $4.8 \times 10^{11}$ atoms/cm², $5.0 \times 10^{11}$ atoms/cm², $5.2 \times 10^{11}$ atoms/cm², $5.7 \times 10^{11}$ atoms/cm², and $6.0 \times 10^{11}$ atoms/cm², respectively. Therefore, as can be seen from FIG. 4, the effective dose of the broad buffer region according to the invention is equal to or more than $4.8 \times 10^{11}$ atoms/cm² and equal to or less than $6.0 \times 10^{11}$ atoms/cm². It was confirmed that, even when the effective dose of the broad buffer region increased to $1.0 \times 10^{12}$ atoms/cm², the breakdown voltage variation width was further reduced and the bulk resistivity was equal to or less than 300 Ωcm.

That is, in the semiconductor device according to the invention, in the broad buffer structure in which the effective dose is equal to or more than $4.8 \times 10^{11}$ atoms/cm$^2$ and equal to or less than $1.0 \times 10^{12}$ atoms/cm$^2$, the breakdown voltage variation width can be reduced to one-third or less of that in the diode according to the related art in which the broad buffer region is not provided. In the broad buffer structure, the effective dose is more preferably equal to or more than $5.0 \times 10^{11}$ atoms/cm$^2$ and equal to or less than $1.0 \times 10^{12}$ atoms/cm$^2$ and is most preferably equal to or more than $5.2 \times 10^{11}$ atoms/cm$^2$ and equal to or less than $1.0 \times 10^{12}$ atoms/cm$^2$, which makes it be able to reliably reduce the breakdown voltage variation width of the semiconductor device to 4% or less.

In particular, when the bulk resistivity is equal to or more than 144 Ωcm, the breakdown voltage variation width of the semiconductor device does not depend on the bulk resistivity. Of course, the breakdown voltage variation width also includes a variation in a parameter, such as the thickness of the n⁻ drift layer or an effective dose according to the formation of the broad buffer region. However, a variation in the thickness of the drift layer may be 3% or less by a combination of the back grinding and etching of the wafer, and the effective dose may be 1% or less by the control of the injection of the proton H⁺ and an annealing temperature. Among factors determining the breakdown voltage variation width, the most important factor is the resistivity variation width. Therefore, the effect obtained by reducing the breakdown voltage variation width is large.

In the invention, the breakdown voltage variation width can be reduced at rated voltages other than the rated voltage $V_0=1200$ V. This is because the total doping concentration (dose) of the entire drift layer is constant (about $1.2 \times 10^{12}$ atoms/cm$^2$ or less), regardless of the rated voltage. At a rated voltage $V_0$ of 1200 V, when the bulk resistivity is equal to or more than 144 Ωcm, the breakdown voltage variation width is equal to or less than 5% which is required by the market. The numerical value "144" corresponds to about 12% ($\approx 144/1200 \times 100\%$) of the numerical value "1200" of the rated voltage. As illustrated in FIG. 5, when the bulk resistivity is equal to or more than 150 Ωcm corresponding to 12.5% of the numerical value "1200" of the rated voltage, the breakdown voltage variation width is further reduced. When the bulk resistivity of the wafer is equal to or more than 160 Ωcm corresponding to 13.3% of the numerical value "1200" of the rated voltage, the breakdown voltage variation width is equal to or less than 4%, which is certainly less than a breakdown voltage variation width of 5% required by the market. Similarly, when the rated voltage $V_0$ is 600 V, the bulk resistivity is 72 Ωcm ($0.12V_0=0.12\times600=72$). Therefore, the breakdown voltage variation width is equal to or less than 5% at a bulk resistivity of 72 Ωcm or more. Similarly, it was confirmed that the breakdown voltage variation width was reduced to 5% or less at a rated voltage $V_0$ of 1700 V and a bulk resistivity of 204 Ωcm or more, at a rated voltage $V_0$ of 3300 V and a bulk resistivity of 396 Ωcm or more, and at a rated voltage $V_0$ of 4500 V and a bulk resistivity of 540 Ωcm or more. Therefore, a necessary condition is that the bulk resistivity of the semiconductor device according to the invention, that is, the resistivity $\rho_0$ of the semiconductor substrate satisfies the following Expression 4.

$$\rho_0 \geq 0.12V_0 \qquad \text{[Expression 4]}$$

When the resistivity $\rho_0$ is preferably equal to or more than $0.125V_0$ and more preferably, equal to or more than $0.133V_0$, the breakdown voltage variation width can be reliably reduced to 5% or less.

When the resistivity $\rho_0$ is more than a necessary value, in general, the depletion of the carriers is accelerated during switching and a switching waveform is likely to oscillate. For example, it was confirmed that, when the bulk resistivity was more than 300 Ωcm at a rated voltage $V_0$ of 1200 V, an oscillation phenomenon occurred due to the depletion of the carriers during reverse recovery even in the diode with the broad buffer structure according to the invention in which the broad buffer region was provided in the drift layer. Further, it was found that, when the bulk resistivity was too high, the oscillation phenomenon commonly occurred at other rated voltages. An important factor of this phenomenon is the total doping concentration (dose) of the entire n⁻ drift layer. This is because the expansion of a space charge region during reverse recovery depends on the total doping concentration (dose) according to the Poisson equation and thus the total number of carriers swept is also determined by the total doping concentration. Therefore, it was confirmed that the same oscillation phenomenon was occurred when the bulk resistivity was more than 300 Ωcm at a rated voltage $V_0$ of 1200 V, the bulk resistivity was more than 150 Ωcm at a rated voltage $V_0$ of 600 V, the bulk resistivity was more than 425 Ωcm at a rated voltage $V_0$ of 1700 V, the bulk resistivity was more than 825 Ωcm at a rated voltage $V_0$ of 3300 V, and the bulk resistivity was more than 1125 Ωcm at a rated voltage $V_0$ of 4500 V. The relation $\rho_0 \leq 0.25V_0$ is established between the rated voltage $V_0$ and the bulk resistivity $\rho_0$. Therefore, the bulk resistivity $\rho_0$ needs to satisfy the following Expression 5.

$$\rho_0 \leq 0.25V_0 \qquad \text{[Expression 5]}$$

The important point of the broad buffer structure according to the invention is that the broad buffer region is formed in a portion of the n⁻ drift layer and comes into contact with a portion with substrate concentration (bulk impurity concentration) or a portion with net doping concentration less than the substrate concentration. In this way, the breakdown voltage can be determined independently from the bulk concentration. As a result, the breakdown voltage variation width can be reduced. In a structure in which the broad buffer region is distributed over the entire n⁻ drift layer, the control of impurity concentration and the breakdown voltage depend only on ion injection and driving. As a result, when the rated voltage is changed, particularly, when the breakdown voltage increases, hydrogen-induced donors are distributed in a wide range of 100 μm or more in the n⁻ drift layer and the impurity concentration thereof needs to be reduced. At present, it is physically very difficult to obtain the above-mentioned concentration distribution of the n⁻ drift layer.

In contrast, in the invention, the main rated voltage $V_0$ can be determined on the basis of the bulk resistivity $\rho_0$. The actual breakdown voltage is determined by adding the impurity concentration of the hydrogen-induced donor to the bulk net doping concentration (that is, resistivity). Therefore, the invention can be applied regardless of the breakdown voltage of the semiconductor device and reduce the influence of the resistivity variation width on the breakdown voltage variation width with the effective dose of the hydrogen-associated donor with a relatively small error. In this way, a diode with a small breakdown voltage variation width can be manufactured with ease.

In FIG. 2(c), the front surface (anode electrode) was irradiated with the proton H⁺ 11. However, as illustrated in FIG. 3(c), the rear surface (cathode electrode) may be irradiated with the proton H⁺ 11. The other processes of the method illustrated in FIG. 3 are the same as those of the manufacturing method illustrated in FIG. 2. That is, the difference between FIG. 2 and FIG. 3 is a process (c).

As described above, according to the semiconductor device of the first embodiment, the broad buffer region 6 is provided in the n⁻ drift layer 1, which is a substrate whose bulk resistivity $\rho_0$ (Ωcm) satisfies Expression 2 with respect to the rated voltage $V_0$ (V). The total amount of the net doping concentration of the broad buffer region 6 is in the above-mentioned range. In this way, even when a variation in the bulk resistivity is about ±12%, the range in which the breakdown voltage of the diode is changed with respect to a variation in the bulk resistivity can be reduced. In addition, the range in which the switching characteristics of the semiconductor device are changed with respect to a variation in the bulk resistivity can be reduced. Therefore, a variation in the breakdown voltage and a variation in the switching characteristics can be reduced.

In addition, according to the method of manufacturing the semiconductor device according to the first embodiment, after the p anode layer 2 is formed on one main surface of the FZ wafer 10 ($n^-$ drift layer 1), the front or rear surface of the FZ wafer 10 is irradiated with the proton $H^+$ 11 at a projected range to a portion which is deeper than the p anode layer 2 or the n+ cathode layer 3 which will be formed in the subsequent process, and a heat treatment is performed at a temperature of 300° C. or more to 550° C. or less. In this way, the broad buffer region 6 can be formed in the $n^-$ drift layer 1 under the above-mentioned condition. In this case, the resistivity (bulk resistivity) $\rho_0$ of the FZ wafer 10 satisfies the above-mentioned condition with respect to the rated voltage $V_0$. In this way, even when a variation in the resistivity of the FZ wafer 10 is about ±12%, the range in which the breakdown voltage of the semiconductor device is changed with respect to a variation in the resistivity of the FZ wafer 10 can be reduced. In addition, the range in which the switching characteristics of the semiconductor device are changed with respect to a variation in the resistivity of the FZ wafer 10 can be reduced. Therefore, a variation in the breakdown voltage and a variation in the switching characteristics can be reduced.

Before the irradiation with the proton $H^+$ 11 in order to form the broad buffer region 6, oxygen is introduced into the FZ wafer 10 under the above-mentioned conditions. In this way, a reduction in the mobility of electrons and holes in the broad buffer region 6 can be prevented when the wafer is irradiated with the proton $H^+$ 11.

In addition, the use of the FZ wafer 10 allows a diode with the broad buffer structure to be manufactured at a low cost. In this way, manufacturing costs can be reduced.

Second Embodiment

Figure 7:
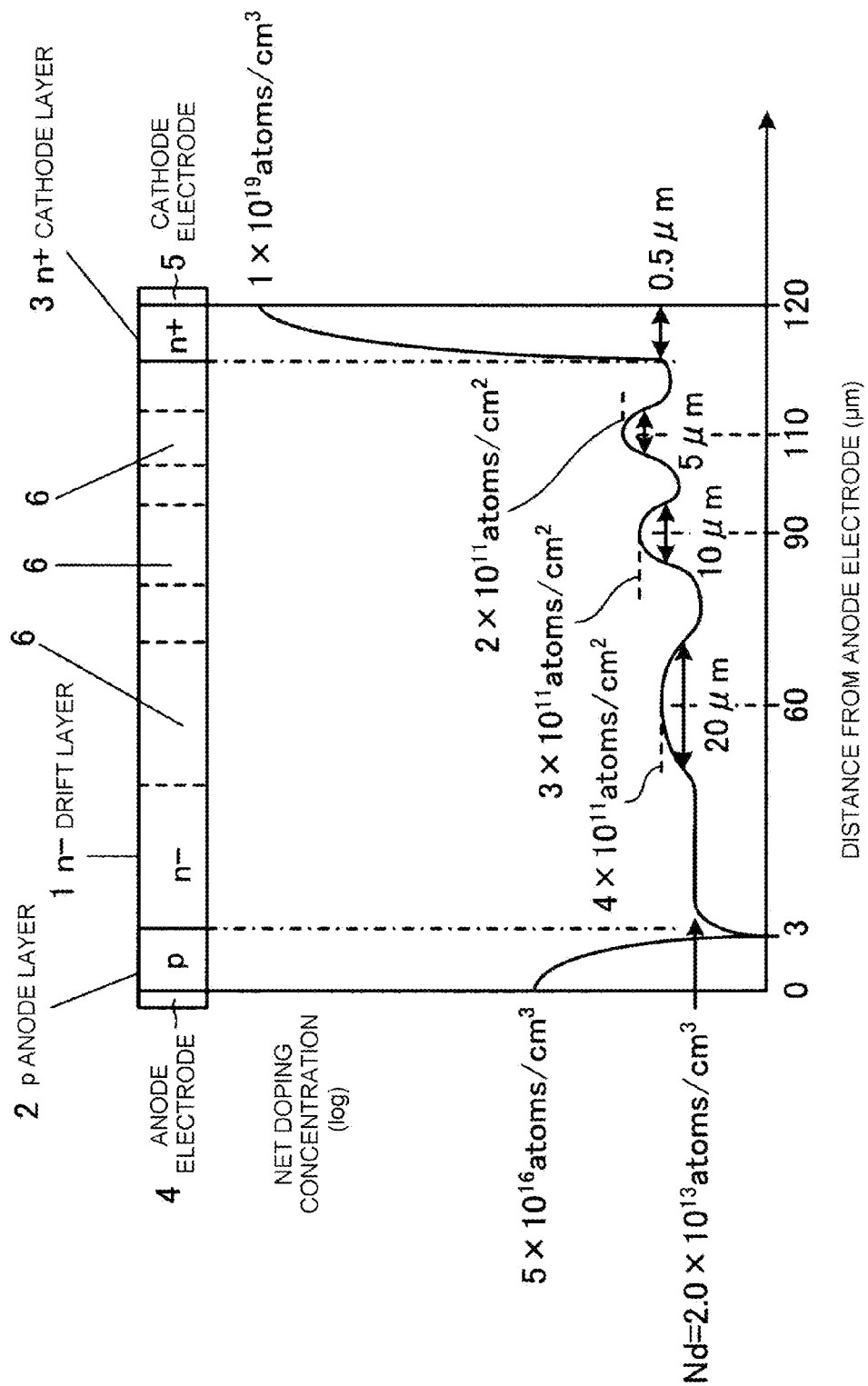
FIG. 7 is a diagram illustrating the structure of a semiconductor device and a net doping concentration distribution according to a second embodiment.

FIG. 7 is a diagram illustrating the structure of a semiconductor device and a net doping concentration distribution according to a second embodiment. A plurality of broad buffer regions 6 according to the first embodiment may be provided in an $n^-$ drift layer 1.

In the second embodiment, as illustrated in FIG. 7, a plurality of broad buffer regions 6 (three broad buffer regions in FIG. 7) are formed. As such, the plurality of broad buffer regions 6 allows fine control on the expansion of a space charge region during switching. In the structure in which a plurality of broad buffer regions are formed, when the rated voltage $V_0$ is 1200 V, it is preferable that bulk resistivity be equal to or more than 144 Ωcm, which is the same as that in the first embodiment. In addition, when the plurality of broad buffer regions 6 are formed, it is easy to form the broad buffer regions with high impurity concentration according to the number of broad buffer regions, as compared to the structure in which one broad buffer region is formed. Therefore, a reduction in the electric field intensity of a space charge region is likely to be large during switching or when a power supply voltage is maintained, as compared to the structure in which one broad buffer region is formed. As a result, the breakdown voltage of the semiconductor device is reduced. Therefore, the bulk resistivity may be further increased and it is preferable that the bulk resistivity be equal to or more than $0.15V_0$. The upper limit of the bulk resistivity is $0.25V_0$, which is the same as described above. The other structures are the same as those of the first embodiment.

Figures 14A, 14B, 14C, 14D:
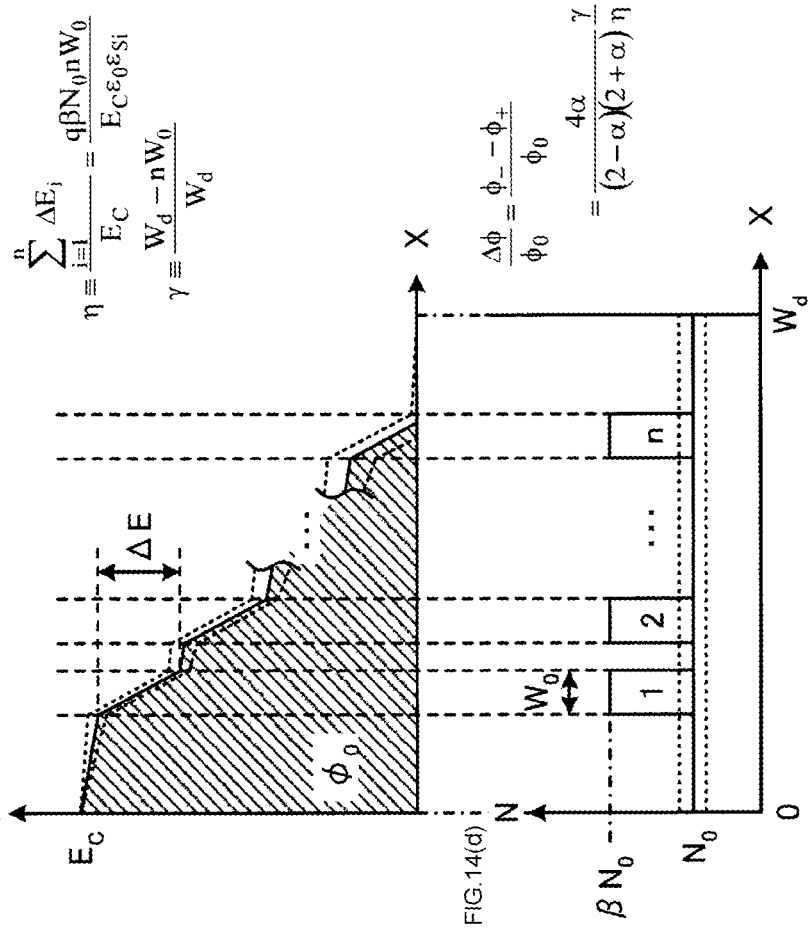
FIG. 14 is a characteristic diagram illustrating the relation between a net doping concentration distribution of a drift layer and an internal electric field intensity distribution when an reverse-bias voltage is applied.

Next, the operation and effect of the structure in which a plurality of broad buffer regions are formed are described. FIG. 14 is a characteristic diagram illustrating the relation between the net doping concentration distribution of a drift layer and an internal electric field intensity distribution when a reverse-bias voltage is applied. In FIG. 14, in a diode including the drift layer with a flat concentration distribution according to the related art and a diode including the drift layer provided with a plurality of broad buffer regions according to the invention, the net doping concentration distribution of the drift layer corresponds to the internal electric field intensity distribution when the reverse-bias voltage is applied. FIGS. 14(a) and 14(b) are diagrams illustrating an electric field intensity distribution ((a)) and a donor concentration distribution ((b)) when an reverse-bias voltage with the same level as that of a breakdown voltage is applied and the maximum value of the electric field intensity becomes a critical electric field intensity $E_C$ (about $2.5 \times 10^5$ V/cm) causing avalanche breakdown in the diode with a flat concentration distribution according to the related art. FIGS. 14(c) and 14(d) are diagrams illustrating an electric field intensity distribution ((c)) and a donor concentration distribution ((d)) when the reverse-bias voltage with the same level as that of the breakdown voltage is applied and the maximum value of the electric field intensity becomes the critical electric field intensity $E_C$ in the diode with a plurality of broad buffer regions according to the invention. In the two diodes, it is assumed that the standard value of the donor concentration of an FZ bulk wafer is $N_0$ and the measured value of the donor concentration of the FZ bulk wafer is $(1+\alpha)N_0$ (or $(1-\alpha)N_0$, $\alpha>0$). Alternatively, when a series of element forming processes is performed, the standard deviation of the measured value of the donor concentration of the FZ bulk wafer in the number of FZ bulk wafers processed as units which flow at the same time (for example, 50 FZ bulk wafers) may be $(1+\alpha)N_0$ (or $(1-\alpha)N_0$, $\alpha>0$). That is, it is assumed that the variation rate of donor concentration is $\pm\alpha$ ($\alpha>0$).

In this embodiment, for example, a known spreading resistance profiling method or C-V method is used as a method of measuring the donor concentration of the wafer. In FIGS. 14(a) and 14(c), for simplicity of explanation, a so-called non-punch through type is illustrated in which a depletion layer does not reach an n-type cathode layer when a voltage with the same level as that of the breakdown voltage is applied. However, a punch through type may be used in which the depletion layer reaches the n-type cathode layer. In this case, the following discussion is established, similarly to the non-punch through type.

For the diode according to the related art, when the Poisson equation is solved under the boundary condition that electric field intensity E is 0 at a depth $x_0$ from a pn junction, a voltage value (breakdown voltage value) $\phi_0$ when donor concentration is $N_0$ is $\phi_0 = -(\frac{1}{2})x_0 E_C$. The maximum and minimum values $\phi_\pm$ of the breakdown voltage value when bulk donor concentration varies by $(1\pm\alpha)N_0$ are $\phi_\pm = \phi_0/(1\pm\alpha/2)$ when electric field intensity is zero at a position $x_\pm$ as the boundary condition. As a result, the variation rate $\Delta\phi/\phi_0$ of the breakdown voltage value is $4\alpha/\{(2-\alpha)(2+\alpha)\}$ (where $\Delta\phi = \phi_- - \phi_+$).

In the diode including a plurality of broad buffer regions according to the invention, strictly, when the Poisson equation is solved, the value of the Poisson equation is complicated. Therefore, in this embodiment, a simple method is used to calculate the variation rate $\Delta\phi/\phi_0$ of the voltage value. First, as illustrated in FIG. 14(d), it is assumed that n broad buffer regions which have a concentration that is $\beta$ times more than the bulk donor concentration $N_0$ and a width $W_0$ are formed. In addition, it is assumed that the impurity concentration of the broad buffer region is ideally distributed and there is no variation in the impurity concentration. It is assumed that $\beta$ is greater than 1. In FIG. 14(c), since the magnitude of the gradient of the electric field intensity of each of the broad buffer regions is $\beta$ times more than that of another broad buffer region, a reduction $\Delta E$ in the electric field intensity which is more than a bulk portion (concentration $N_0$) occurs. When the "reduction" in the electric field intensity continuously occurs n times, the ratio $\gamma$ of the total length of a portion in which the "reduction" in the electric field intensity does not occur, that is, a bulk portion other than the broad buffer region with respect to the overall width Wd of the drift layer is $(W_d-nW_0)/W_d$. Since $n \geq 2$ and $0<W_0<W_d$ are satisfied, $\gamma$ is equal to or greater than 0 and equal to or less than 1. On the other hand, the ratio $\eta$ of the electric field intensity $\Delta E$ which is reduced n times with respect to the maximum value $E_C$ of the same electric field intensity is $\Sigma_i \Delta E_i/E_C = q\beta N_0 n W_0/(E_C \epsilon_0 \epsilon_{Si})$ (where q is an elementary electric charge, $\epsilon_0$ is the permittivity of vacuum, and $\epsilon_{Si}$ is the relative permittivity of silicon). $\eta$ is equal to or greater than 0 and equal to or less than 1. That is, it is assumed that the variation rate of the voltage value when a plurality of broad buffer regions are provided is a value obtained by removing the contribution of the broad buffer region which is not affected by a variation in bulk concentration and the contribution of a portion in which electric field intensity is "reduced" in the broad buffer region from the variation rate in the diode with a flat concentration distribution according to the related art. On the basis of the assumption, the variation rate $\Delta\phi/\phi_0$ of the voltage value is obtained by multiplying the same rate in the diode with a flat concentration distribution according to the related art by a factor $(\gamma/\eta)$. Therefore, $\Delta\phi/v_0 = 4\alpha(\gamma/\eta)/\{(2-\alpha)(2+\alpha)\}$ is established. When a is more than 0% and equal to or less than 12%, $\Delta\phi/v_0$ can be approximate to $4\alpha/\{(2-\alpha)(2+\alpha)\} \approx \alpha$ in the range and $\Delta\phi/\phi_0 \approx \alpha(\gamma/\eta)$ is established. As the total number n of broad buffer regions increases, $\gamma$ is reduced. Therefore, the variation width $\Delta\phi/\phi_0$ of the voltage value is reduced. In addition, the ratio $\eta$ of the "reduction" in electric field intensity increases as the concentration of the broad buffer region is more than the bulk concentration $N_0$ (that is, $\beta$ increases) or the number n of broad buffer regions increases. In addition, as the width $W_0$ of the broad buffer region increases, $\eta$ increases. Therefore, as the number of broad buffer regions with high concentration and a large width increases, theoretically, the variation rate $\Delta\phi/\phi_0$ of the voltage (breakdown voltage) is reduced.

For example, for an FZ bulk wafer with a standard value of $N_0 = 2 \times 10^{13}$ atoms/cm$^3$, it is assumed that the variation rate $\alpha$ of $N_0$ is 12%, the number n of broad buffer regions formed is 3, the width $W_0$ is 6 μm, and the multiple $\beta$ of the concentration of the broad buffer region with respect to $N_0$ is 10. In this case, since $\eta$ is 2.19 and $\gamma$ is 0.85, the variation rate $\Delta\phi/\phi_0$ of the breakdown voltage is 0.047 (4.7%), which is significantly less than a, and a breakdown voltage variation width of 5% which is required by the market can be satisfied. Therefore, when a plurality of broad buffer regions are formed so as to satisfy the conditions of the following Expression 6, it is possible to reduce the variation rate $\Delta\phi/\phi_0$ of the breakdown voltage value to be less than the variation rate of the FZ bulk wafer, which is preferable.

$$4\alpha(\gamma/\eta)/\{(2-\alpha)(2+\alpha)\} < \alpha \qquad \text{[Expression 6]}$$

In addition, when a plurality of broad buffer regions are formed so as to satisfy $4\alpha(\gamma/\eta)/\{(2-\alpha)(2+\alpha)\} \leq 0.05$, it is possible to reliably reduce the variation rate $\Delta\phi/\phi_0$ of the breakdown voltage value to be less than the variation rate of the FZ bulk wafer, which is preferable.

The above-mentioned consideration is ideal. For example, when $\beta$ (a multiple of the concentration of the broad buffer region with respect to the bulk concentration $N_0$) is too large or when n (the number of broad buffer regions) is too large, the total "reduction" in the electric field intensity increases and it is difficult to obtain a sufficient breakdown voltage. When $\beta$ is only a value which is sufficiently close to 1, there is no large difference between the "reduction" $\Delta E$ in the electric field intensity and a reduction in the bulk electric field intensity and the effect of the broad buffer region is reduced, which makes it difficult to prevent a breakdown voltage variation. Therefore, $\beta$, $W_0$, and n need to be determined on the basis of the breakdown voltage, a variation in the breakdown voltage, and the effect of preventing reverse recovery oscillation. In addition, the shape of each broad buffer region is close to a Gaussian distribution by irradiation with protons. A half width indicating the expansion of the Gaussian distribution corresponds to $W_0$ and depends on proton acceleration energy. When the broad buffer region is formed by irradiation with the protons, for example, it is considered that donor concentration is integrated over a given broad buffer region and the integrated value is averaged by the half width. That is, since the "reduction" $\Delta E$ in the electric field intensity is determined by the total sum (effective dose) of the integrated value of the broad buffer region, it does not greatly depend on the difference between the shapes of the broad buffer regions (whether the shape is a rectangular shape or a Gaussian distribution). Therefore, the selection of $\beta$, $W_0$, and n is actually to determine the total integrated concentration of each broad buffer region.

In addition, the above-mentioned Expression 6 is established, without depending on the rated voltage. The reason is as follows. The dependence of the critical electric field intensity $E_c$ on the concentration of the bulk wafer which is determined according to the rated voltage is weak and it is considered that the dependence is a substantially constant value. In addition, the "reduction" $\Delta E$ in the electric field intensity does not depend on the concentration of each broad buffer region or the concentration of the bulk wafer, but depends on the integrated value (total concentration or an effective dose) of the concentration of each broad buffer region or the concentration of the bulk wafer.

The sum of the effective doses of the plurality of broad buffer regions 6 (FIG. 7) may be equal to or more than $4.8 \times 10^{11}$ atoms/cm$^2$ and equal to or less than $1.0 \times 10^{12}$ atoms/cm$^2$, as in the first embodiment. In the second embodiment, when three broad buffer regions 6 have peak concentrations and half widths illustrated in FIG. 7, the integrated concentrations of the broad buffer regions are $4 \times 10^{11}$ atoms/cm$^2$ (the peak concentration is $2 \times 10^{14}$ atoms/cm$^3$ and the half width is 20 μm), $3 \times 10^{11}$ atoms/cm$^2$ (the peak concentration is $3 \times 10^{14}$ atoms/cm$^3$ and the half width is 10 μm), and $2 \times 10^{11}$ atoms/cm$^2$ (the peak concentration is $4 \times 10^{14}$ atoms/cm$^3$ and the half width is 5 μm) in increasing order of the distance from an anode electrode 4, and the sum of the integrated concentrations is $9 \times 10^{11}$ atoms/cm$^2$.

It is preferable that the number of broad buffer regions 6 is two or more and five or less so as to satisfy the above-mentioned effective dose. When the rated voltage is equal to or more than 3300 V, the total thickness of the drift region is equal to or more than 300 μm and there is a sufficient margin for the thickness. Therefore, the number of broad buffer regions may be five or more, if necessary. In addition, as described above, in the case in which the sum of the integrated concentrations of the broad buffer regions is constant, the shape or position of each of the broad buffer regions is changed, the variation rate of the breakdown voltage is not changed by a value corresponding to the change in the shape or position. For example, the depth of the broad buffer region which is closest to the anode electrode from the anode electrode is set to be more than $W_d/2$, thereby ensuring a region with low impurity concentration (high resistance) in the drift layer in the vicinity of the pn junction. In this way, it is possible to prevent an increase in electric field intensity in the vicinity of the pn junction during reverse recovery or when a cosmic ray is incident. Alternatively, the number of broad buffer regions close to a cathode electrode from the intermediate position of the drift layer may be more than the number of broad buffer regions (including zero) close to the anode electrode from the intermediate position. In this case, the same effect is obtained, which is preferable.

Even when a plurality of broad buffer regions 6 are formed, the front surface or the rear surface may be irradiated with protons in order to form each of the broad buffer regions 6. In the case of a diode, for at least the broad buffer region 6 closest to the anode layer, it is preferable that the surface of the anode layer 2 be irradiated with protons, thereby reducing the carrier lifetime values of a proton transmission region and a proton stop region to be less than that of the bulk.

As described above, according to the second embodiment, it is possible to obtain the same effect as that of the first embodiment. Since a plurality of broad buffer regions 6 are formed in the n⁻ drift layer 1, it is possible to finely adjust the expansion of a space charge region during switching.

Third Embodiment

Figure 8:
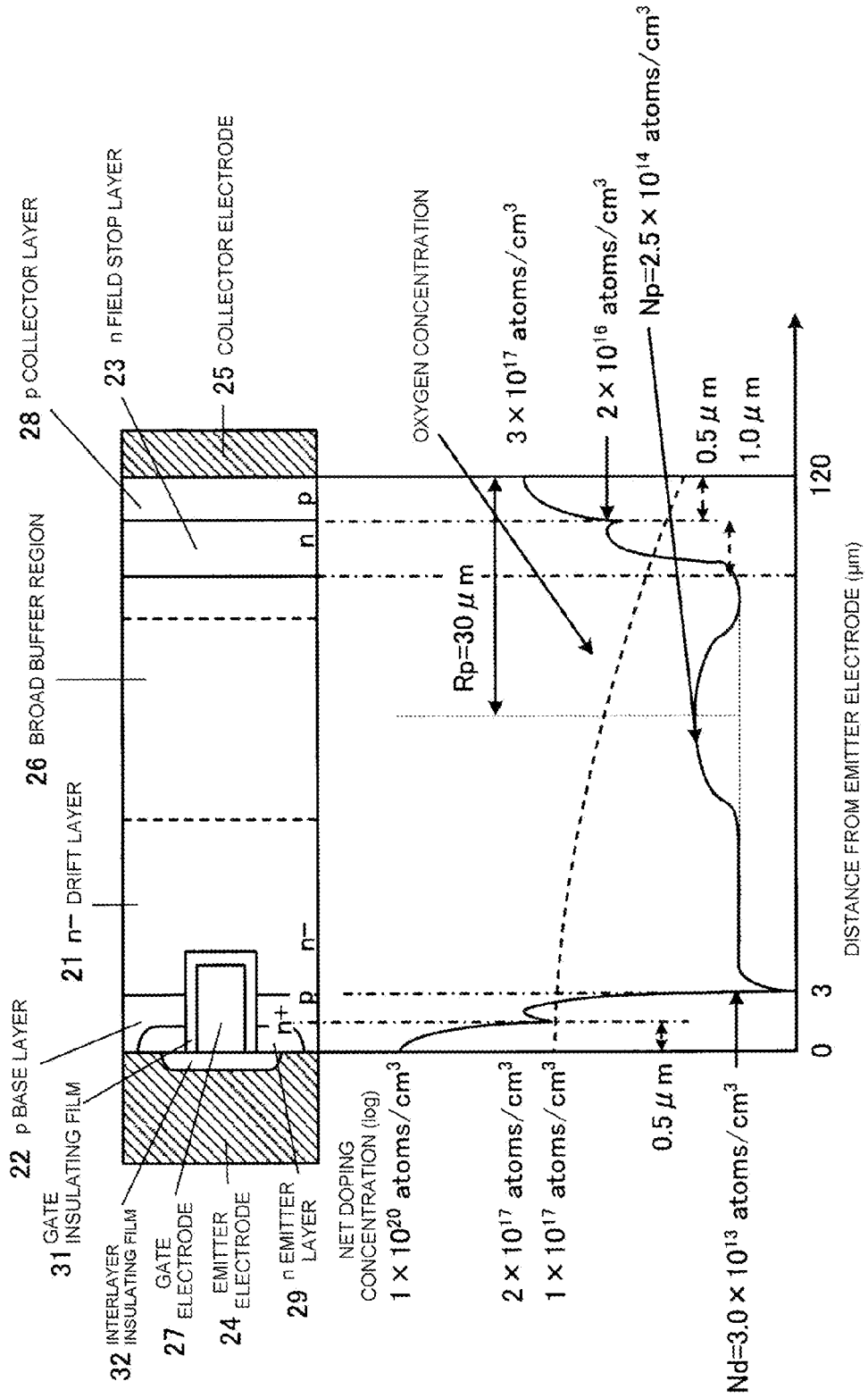
FIG. 8 is a diagram illustrating the structure of a semiconductor device and a net doping concentration distribution according to a third embodiment.

FIG. 8 is a diagram illustrating the structure of a semiconductor device and a net doping concentration distribution according to a third embodiment. The structure of the semiconductor devices according to the first and second embodiments may be applied to an IGBT.

As illustrated in the cross-sectional view (the upper side of the plane of paper) of the semiconductor device in FIG. 8, in the IGBT according to the third embodiment, a p base layer 22 is formed on the front surface (first main surface) of an n-type semiconductor substrate (wafer). A p collector layer 28 is formed on the rear surface (second main surface) of the wafer. A portion of the semiconductor substrate between the p base layer 22 and the p collector layer 28 is an n⁻ drift layer 21. Bulk resistivity $\rho_0$ (Ωcm) is the same as that in the first embodiment. That is, the bulk resistivity is in the range represented by the above-mentioned Expression 2 or the above-mentioned preferred range. An emitter electrode 24 is formed on the surface of the p base layer 22. A collector electrode 25 is formed on the surface of the p collector layer 28. A trench is formed in the front surface of the wafer so as to reach the n⁻ drift layer 21 through the p base layer 22 and a gate insulating film 31 is formed on the inner wall of the trench. A gate electrode 27 is buried in the trench through the gate insulating film 31. An n emitter layer 29 is formed in the p base layer 22. The emitter electrode 24 electrically connects the p base layer 22 and the n emitter layer 29. In addition, the emitter electrode 24 is insulated from the gate electrode 27 by the gate insulating film 31 and an interlayer insulating film 32 formed on the gate electrode 27.

In FIG. 8, as illustrated in a characteristic diagram (the lower side of the plane of paper) illustrating the relation between the distance from the emitter electrode 24 and net doping concentration (log), the net doping concentration of the n⁻ drift layer 21 has a peak substantially in the vicinity of the middle of the n⁻ drift layer 21 and is inclined so as to be reduced toward the p base layer 22 and the p collector layer 28. That is, an n-type broad buffer region 26 which has an impurity concentration more than that of the n⁻ drift layer 21 and has a net doping concentration less than that of the p base layer 22 and the p collector layer 28 is formed in the n⁻ drift layer 21. The effective dose (the total amount of the net doping concentration of the same layer) of the broad buffer region 26 is equal to or more than $4.8 \times 10^{11}$ atoms/cm² and equal to or less than $1.0 \times 10^{12}$ atoms/cm² or in the above-mentioned preferred range, which is the same as that in the diode according to the first embodiment. The broad buffer region 26 may be formed by irradiating the wafer including the p base layer 22 and the emitter electrode 24 with a proton H⁺ 11 from the collector electrode 25 and performing a heat treatment on the wafer. FIG. 8 illustrates an IGBT with a trench gate structure, but an IGBT with a planar gate structure may be used.

Since the p collector layer 28 is formed on the rear surface of the IGBT, minority carriers are injected into the rear surface. Therefore, during turn-off, it is necessary to prevent the injected minority carriers from reaching a space charge region through a charge neutral region. In addition, when a voltage corresponding to the breakdown voltage is applied, it is preferable that the charge neutral region which is not depleted be ensured in the range of about 5 μm to about 20 μm from the rear surface, in order to prevent avalanche breakdown. Therefore, it is preferable that the peak of the net doping concentration distribution of the broad buffer region 26 be provided so as to lean to the collector electrode 25 from the depth of the center of the n⁻ drift layer 21 to reliably prevent a depletion layer, thereby ensuring the above-mentioned charge neural region.

Figure 9:
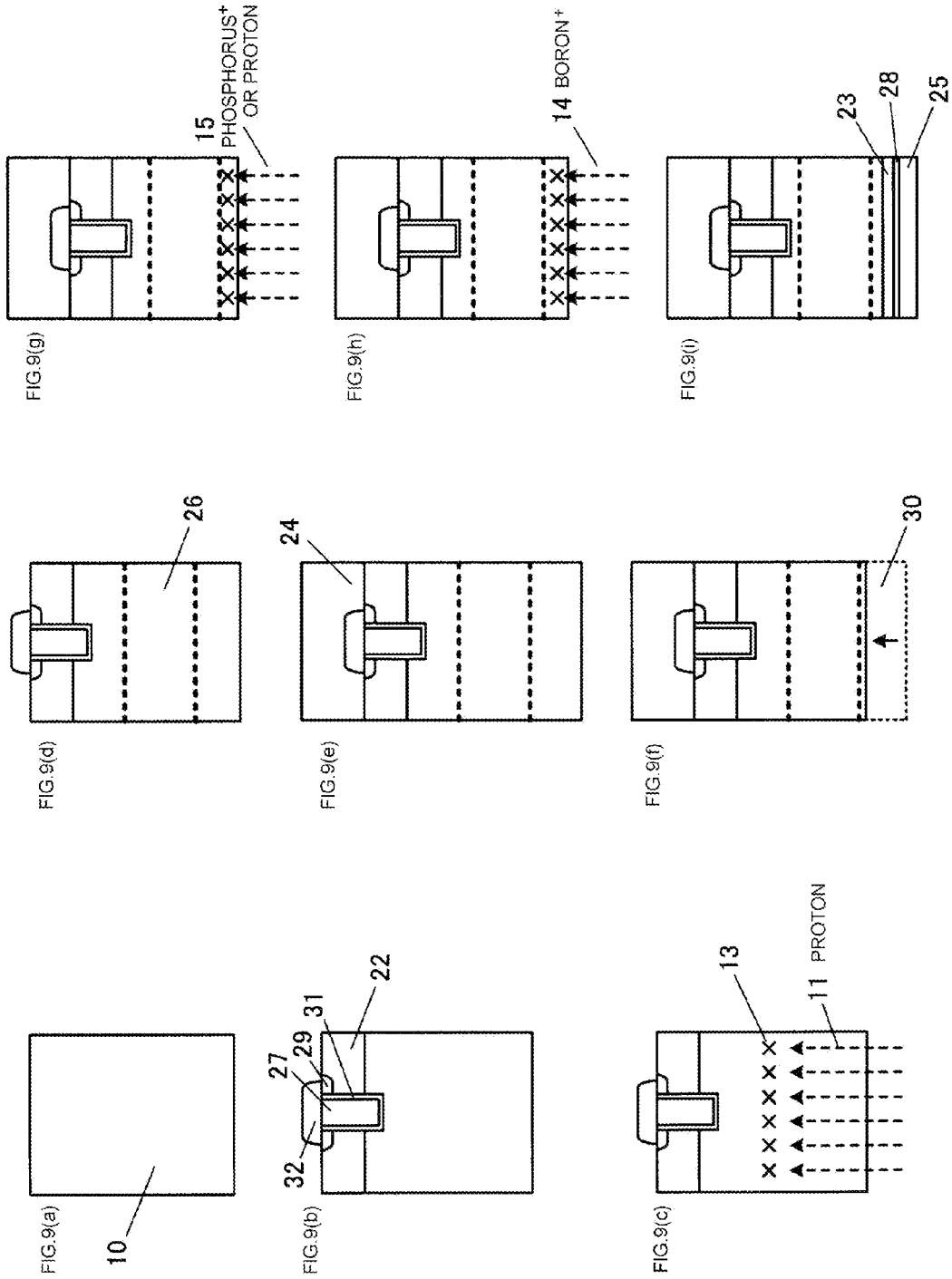
FIG. 9 is a diagram illustrating a process of manufacturing the semiconductor device according to the third embodiment.
Figure 10:
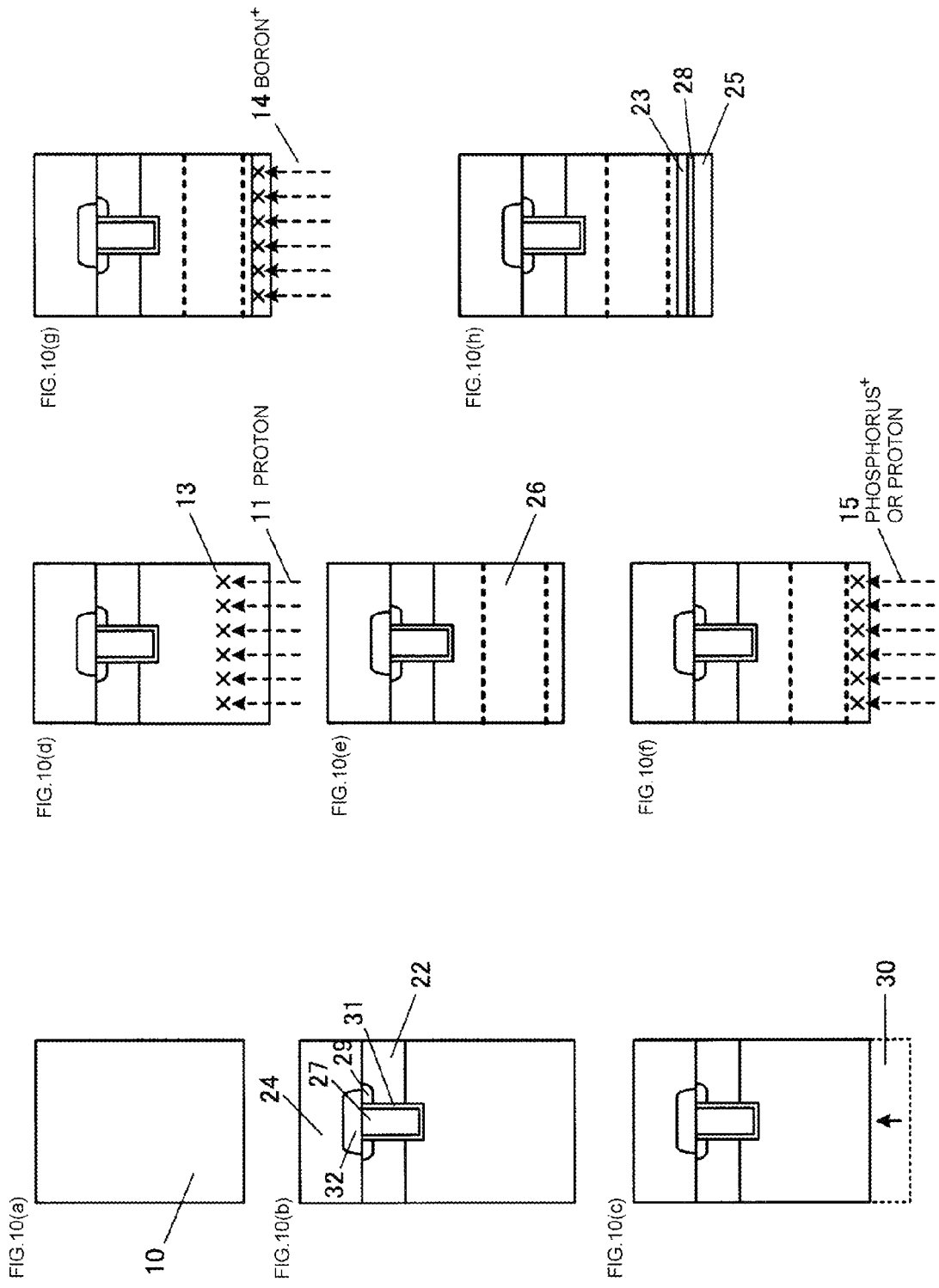
FIG. 10 is a diagram illustrating another example of the process of manufacturing the semiconductor device according to the third embodiment.
Figure 11:
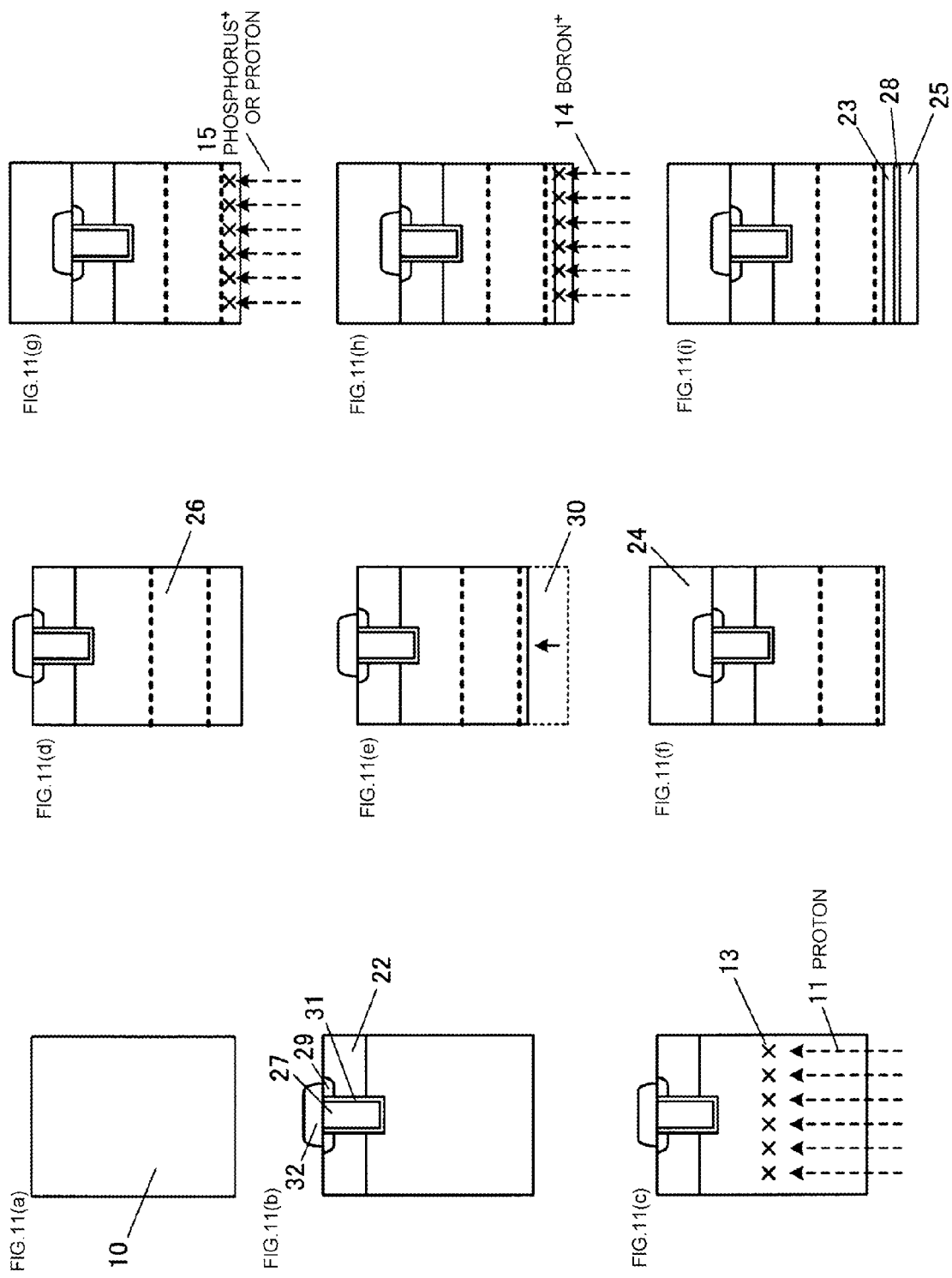
FIG. 11 is a diagram illustrating another example of the process of manufacturing the semiconductor device according to the third embodiment.
Figure 12:
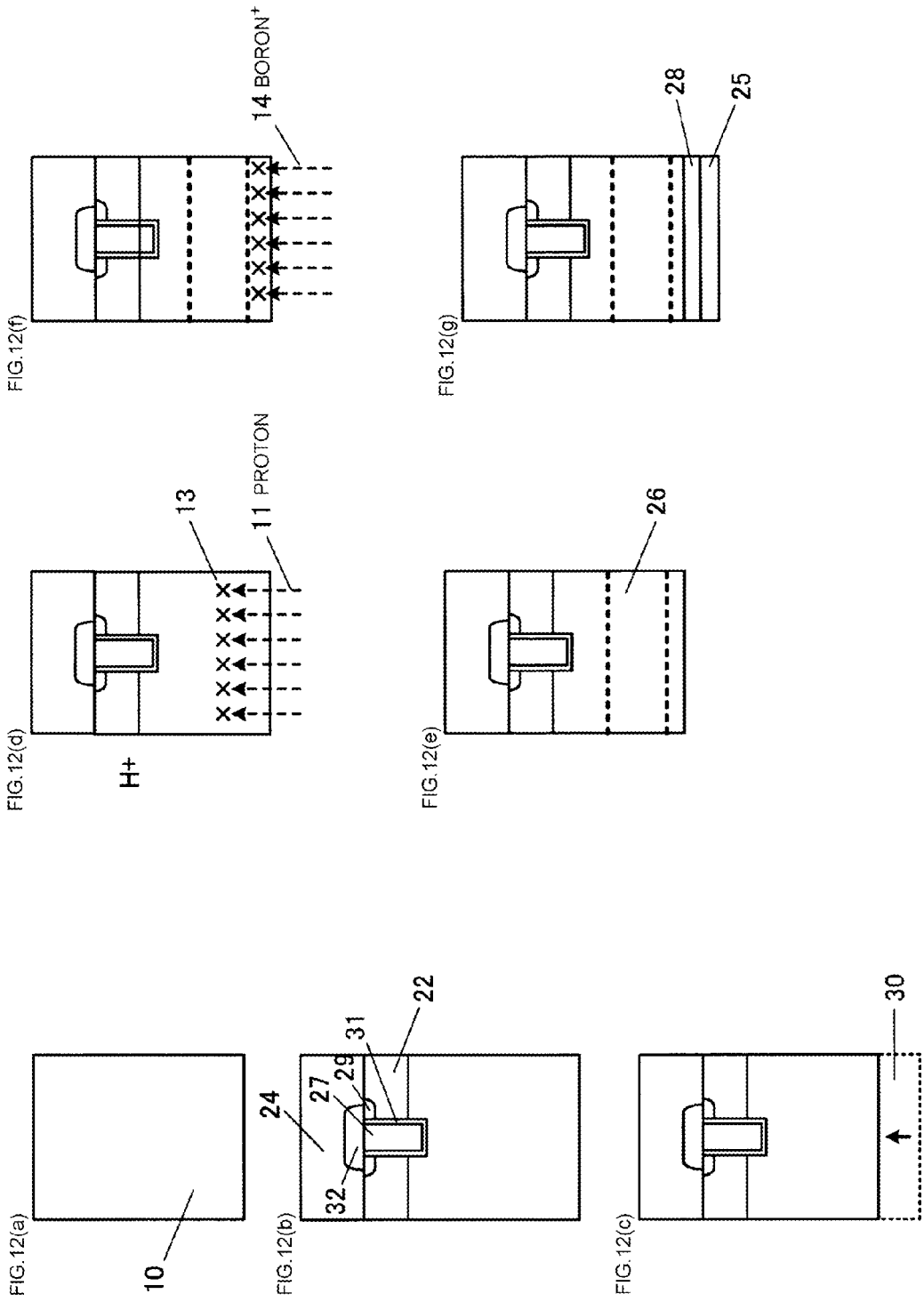
FIG. 12 is a diagram illustrating another example of the process of manufacturing the semiconductor device according to the third embodiment.

Next, a process of manufacturing the IGBT according to the third embodiment will be described in detail. FIG. 9 is a diagram illustrating a process of manufacturing the semiconductor device according to the third embodiment. FIGS. 10 to 12 are diagrams illustrating another example of the process of manufacturing the semiconductor device according to the third embodiment. For example, a case in which an IGBT (rated voltage: $V_0$=1200 V; and rated current: 150 A) with the dimensions and net doping concentration illustrated in FIG. 8 is manufactured will be described.

An example of a method of manufacturing the IGBT according to the third embodiment will be described with reference to FIGS. 9(a) to 9(i). First, as a wafer (semiconductor substrate), an FZ wafer 10 with a bulk resistivity of 144 Ωcm to 300 Ωcm, for example, 150 Ωcm (phosphorus concentration: $2.0 \times 10^{13}$ atoms/cm³) and a thickness of about 500 μm is prepared. The FZ wafer 10 is referred to as a first semiconductor layer (FIG. 9(a)). As described in the first embodiment, oxygen with a concentration higher than solid solubility at room temperature (for example, 20° C.) may be diffused and introduced into the FZ wafer 10 in advance by a drive-in process.

Then, the p base layer 22, a edge termination structure portion including a guard ring (not illustrated), a trench, the gate insulating film 31 in the trench, the gate electrode 27, the n emitter layer 29, and the interlayer insulating film 32 are formed on one main surface of the FZ wafer 10 by a standard IGBT manufacturing process (FIG. 9(b)). The impurity concentration of the p base layer 22 is, for example, $2 \times 10^{17}$ atoms/cm$^3$ and the junction depth thereof is, for example, 3 µm from the surface. The impurity concentration of the n emitter layer 29 is $1 \times 10^{20}$ atoms/cm$^3$ and the junction depth thereof is, for example, 0.5 µm from the surface. The gate electrode 27 may be made of, for example, polysilicon.

Then, the front surface, the other main surface, (on which the collector electrode 25 will be formed later) of the FZ wafer 10 is irradiated with the proton H$^+$ 11 accelerated by a cyclotron (FIG. 9(c)). At that time, the acceleration voltage of the cyclotron is, for example, 7.9 MeV and the dose of the proton H$^+$ 11 is $1.0 \times 10^{14}$ atoms/cm$^2$. In addition, an aluminum absorber is used to adjust the thickness of the proton H$^+$ 11 such that it is 90 µm from the surface of the silicon substrate. When the thickness of the FZ wafer 10 is, for example, 500 µm, the thickness of the proton H$^+$ 11 is adjusted such that the range of the proton H$^+$ 11 is 410 µm. This range may be adjusted by an acceleration voltage using an electrostatic accelerator. In this case, the acceleration voltage is 7.5 MeV. In FIG. 9(c), a crystal defect 13 which occurs in the FZ wafer 10 due to irradiation with the proton H$^+$ 11 is represented by X.

Then, a heat treatment is performed, for example, at 500° C. for 5 hours in a nitrogen atmosphere (which may include hydrogen) to recover the crystal defect 13. In this way, an n-type high-concentration region is formed before and after a depth of 30 µm from the rear surface of the wafer. A desired broad buffer region 26 is formed by the high-concentration region (FIG. 9(d)).

Then, the emitter electrode 24 is formed so as to come into contact with the n emitter layer 29. In addition, a protective film (not illustrated) is formed on the edge termination structure portion including a guard ring (FIG. 9(e)). The emitter electrode 24 is made of, for example, Al—Si (1%) and the protective film is, for example, a polyimide or silicon nitride (SiN) film.

Then, the grinding and wet etching 30 is performed on the rear surface of the FZ wafer 10 to reduce the thickness of the FZ wafer 10 to a desired value (FIG. 9(f)). In this stage, the thickness of the FZ wafer 10 is typically in the range of 100 µm to 160 µm when the rated voltage V$_0$ is 1200 V. In the third embodiment (FIG. 9), in this stage, the thickness of the FZ wafer 10 is 120 µm.

Then, the FZ wafer surface (rear surface) of the FZ wafer 10 subjected to the grinding and wet etching 30 is irradiated with n-type impurities, such as protons H$^+$ or phosphorus$^+$ 15 which will form an n field stop layer 23. The dose is set such that impurity concentration after activation (which will be described below) is, for example, $2 \times 10^{16}$ atoms/cm$^3$ (FIG. 9(g)). Then, p-type impurities, such as boron$^+$ 14 which will form the p collector layer 28, are introduced by ion injection (FIG. 9(h)). At that time, the acceleration voltage is, for example, 50 keV and the dose is set such that impurity concentration after activation is $3 \times 10^{17}$ atoms/cm$^3$. The effective dose of the n field stop layer 23 is set to the range which includes the broad buffer region 26 and satisfies the above-mentioned effective dose condition.

Then, laser annealing is performed to electrically activate the ion injection surface, thereby forming the p collector layer 28. In order to perform the activation, furnace annealing may be performed instead of the laser annealing. In the case of the furnace annealing, for example, a heat treatment is performed at 450° C. for 5 hours in a nitrogen atmosphere (which may include hydrogen) to perform the activation.

Finally, metal materials are deposited on the surface of the p collector layer 28 in the order of, for example, Al—Si (1%), titanium, nickel, and gold to form the collector electrode 25 which comes into ohmic contact with the surface of the p collector layer 28. In this way, the IGBT is completed (FIG. 9(i)).

Next, modifications of the third embodiment will be described. A modification (hereinafter, referred to as a second manufacturing method) of the method of manufacturing the IGBT illustrated in FIG. 9 (hereinafter, referred to as a first manufacturing method) will be described with reference to FIGS. 10(a) to 10(h). The second manufacturing method differs from the first manufacturing method illustrated in FIG. 9 in that irradiation with the proton H$^+$ 11 (see FIG. 9(c)) is performed after the emitter electrode 24 and the protective film are formed and the grinding and wet etching 30 is performed on the rear surface of the FZ wafer 10. The second manufacturing method illustrated in FIG. 10 is effective when the heat-resistance temperature of the emitter electrode 24 and the protective film of the edge termination structure portion is higher than a heat treatment temperature after the irradiation with the proton H$^+$.

Specifically, a process from the preparation of the FZ wafer 10 to the formation of a MOS gate, which is an element surface structure, and the edge termination structure portion is the same as that illustrated in FIGS. 9(a) and 9(b). Then, the emitter electrode 24 and a protective film (not illustrated) made of, for example, polyimide are formed (FIG. 10(b)). Then, grinding and wet etching 30 is performed on the rear surface of the FZ wafer 10 to reduce the thickness of the FZ wafer 10 to a desired value (FIG. 10(c)). Then, the rear surface of the wafer is irradiated with the proton H$^+$ 11 (FIG. 10(d)) and a heat treatment is performed (FIG. 10(e)). During the irradiation with the proton H$^+$, the range of the proton H$^+$ 11 is adjusted in the range of the upper limit of the acceleration voltage by an irradiation accelerator. For example, when the range of the proton H$^+$ from the rear surface is set to 30 µm in an electrostatic accelerator, acceleration energy is 1.5 MeV. Alternatively, a cyclotron accelerator may be used and the range may be adjusted by an aluminum absorber. The process after FIG. 10(f) is the same as that after FIG. 9(g) in the first manufacturing method. When the IGBT is formed by the second manufacturing method, it is possible to reduce the number of processes after the thickness of the FZ wafer 10 is reduced and thus reduce a defect, such as the breaking of the wafer due to the handling of a thin wafer.

Next, a first modification (hereinafter, referred to as a third manufacturing method) of the first manufacturing method illustrated in FIG. 9 will be described with reference to FIGS. 11(a) to 11(i). The third manufacturing method differs from the first manufacturing method illustrated in FIG. 9 in that the grinding and wet etching 30 of the rear surface (FIG. 9(f)) and the process of forming the emitter electrode 24 (FIG. 9(e)) are reversed in FIG. 9 (see FIGS. 11(e) and 11(f)). The other processes are the same as those in the first manufacturing method illustrated in FIG. 9. When the heat treatment temperature after irradiation with the proton H$^+$ 11 is higher than the heat-resistant temperature of the emitter electrode 24, the IGBT according to the third embodiment may be manufactured by the third manufacturing method illustrated in FIG. 11.

Next, a modification (hereinafter, referred to as a fourth manufacturing method) of the second manufacturing method illustrated in FIG. 10 will be described with reference to FIGS. 12(a) to 12(g). The fourth manufacturing method differs from the second manufacturing method illustrated in FIG. 10 in that the process of introducing the n field stop layer adjacent to the p collector layer 28 illustrated in FIG. 10(f) (the introduction of phosphorus or proton H+ into the wafer) is not performed and an IGBT with a structure in which the expansion of the depletion layer is stopped by the broad buffer region 26 such that the depletion layer does not reach the p collector layer. In this way, it is possible to improve the injection efficiency of holes only by adjusting the concentration and introduction depth of the p collector layer 28 on the rear surface of the wafer. The other processes are the same as those in the second manufacturing method illustrated in FIG. 10.

In the third embodiment, the IGBT with a trench gate structure has been described. However, the invention may be applied to an IGBT with a planar gate structure.

As described above, according to the third embodiment, in the IGBT, it is possible to obtain the same effect as that of the first embodiment.

Fourth Embodiment

Figure 13:
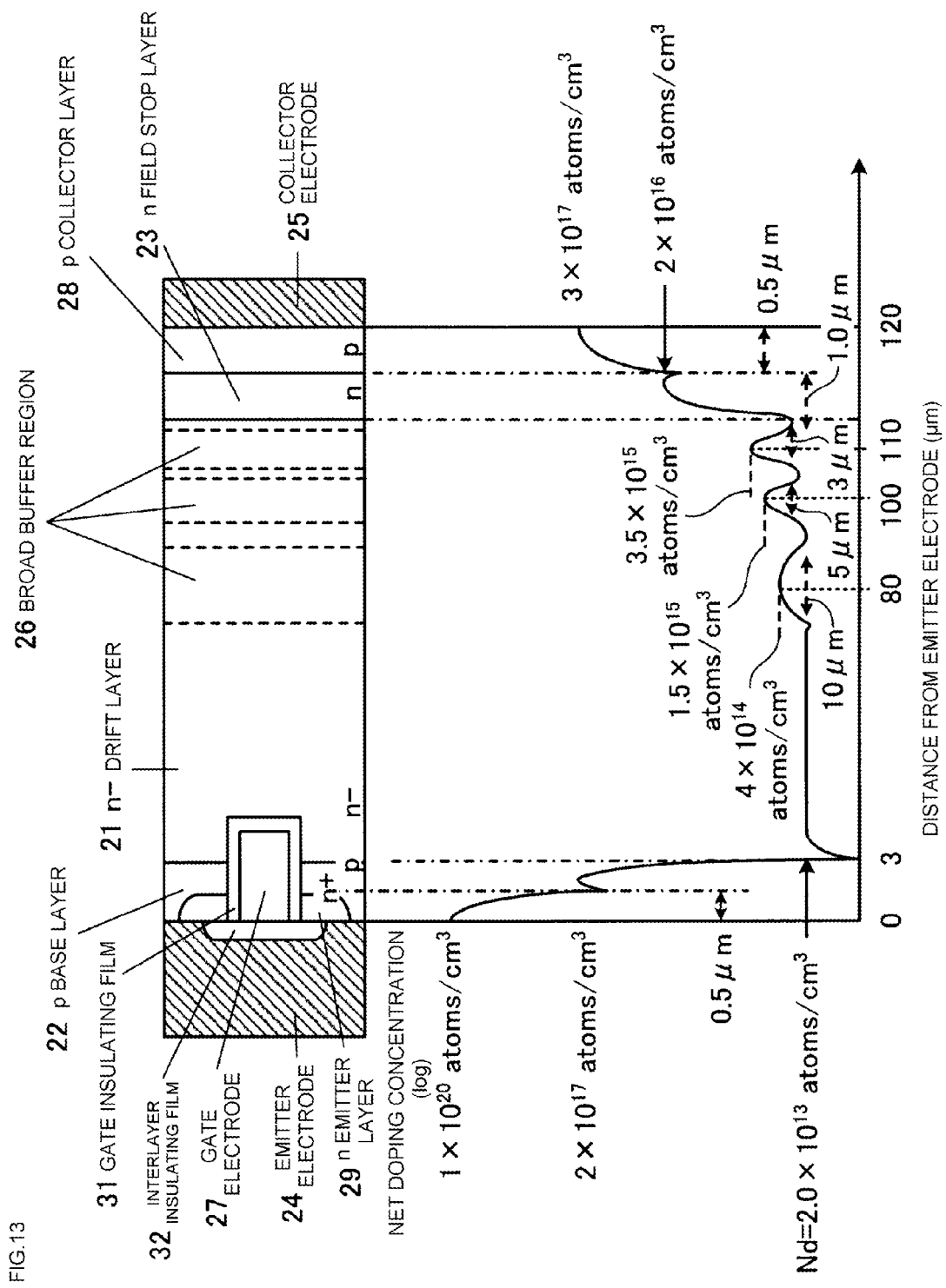
FIG. 13 is a diagram illustrating the structure of a semiconductor device and a net doping concentration distribution according to a fourth embodiment.

FIG. 13 is a diagram illustrating the structure of a semiconductor device and a net doping concentration distribution according to a fourth embodiment. A plurality of broad buffer regions 26 according to the third embodiment may be provided in the n− drift layer 21.

In the fourth embodiment, as illustrated in FIG. 13, a plurality of broad buffer regions 26 (three broad buffer regions in FIG. 13) are formed. As such, when a plurality of broad buffer regions 26 are provided, it is possible to finely control the expansion of a space charge region during switching. In the structure in which a plurality of broad buffer regions are formed, when the rated voltage $V_0$ is 1200 V, it is preferable that bulk resistivity be equal to or more than 144 Ωcm, which is the same as that in the first embodiment. In addition, when a plurality of broad buffer regions 26 are formed, it is easy to form the broad buffer regions with high impurity concentration according to the number of broad buffer regions, as compared to the structure in which one broad buffer region is formed. Therefore, a reduction in the electric field intensity of a space charge region is likely to be large during switching or when a power supply voltage is maintained, as compared to the structure in which one broad buffer region is formed. As a result, the breakdown voltage of the semiconductor device is reduced. Therefore, the bulk resistivity may be further increased and it is preferable that the bulk resistivity be equal to or more than $0.15V_0$. The upper limit of the bulk resistivity is $0.25V_0$, which is the same as described above. The other structures are the same as those of the third embodiment.

The sum of the effective doses of the plurality of broad buffer regions 26 may be equal to or more than $4.8 \times 10^{11}$ atoms/cm$^2$ and equal to or less than $1.0 \times 10^{12}$ atoms/cm$^2$, as illustrated in the first embodiment. In the fourth embodiment, when three broad buffer regions 26 have peak concentrations and half widths illustrated in FIG. 13, the first broad buffer region closest to an emitter electrode 24 has a peak concentration of $4 \times 10^{14}$ atoms/cm$^3$ and a half width of 10 μm, the second broad buffer region has a peak concentration of $1.5 \times 10^{15}$ atoms/cm$^3$ and a half width of 5 μm, and the third broad buffer region furthest from the emitter electrode 24 has a peak concentration of $3.5 \times 10^{15}$ atoms/cm$^3$ and a half width of 3 μm. The integrated concentrations of the broad buffer regions 26 are $2 \times 10^{11}$ atoms/cm$^2$, $3 \times 10^{11}$ atoms/cm$^2$, and $4 \times 10^{11}$ atoms/cm$^2$ in increasing order of the distance from the emitter electrode 24, and the sum of the integrated concentrations is $8 \times 10^{11}$ atoms/cm$^2$. In addition, the peak concentration of the n field stop layer 23 is substantially $1.0 \times 10^{12}$ atoms/cm$^2$ and the sum of the effective doses (integrated concentrations) of n-type layers (the n− drift layer 21, the broad buffer regions 26, and an n field stop layer 23) is $1.8 \times 10^{12}$ atoms/cm$^2$.

The IGBT needs to be designed such that a snapback phenomenon (negative resistance phenomenon in which a large voltage drop occurs between the collector and emitter electrodes once without conductivity modulation due to a very small amount of current and the voltage drop is rapidly reduced due to conductivity modulation, which results in the flow of current) does not occur in an IV output waveform when the gate is turned on. Therefore, the sum of the integrated concentrations of the three n-type layer may not exceed $2.0 \times 10^{12}$ atoms/cm$^2$. The depletion layer in an off state should not reach a p collector layer 28. Therefore, the sum of the integrated concentrations of the three n-type layer needs to be more than $1.2 \times 10^{12}$ atoms/cm$^2$. For that reason, the sum of the integrated concentrations of the three n-type layer may be equal to or more than $1.2 \times 10^{12}$ atoms/cm$^2$ and equal to or less than $2.0 \times 10^{12}$ atoms/cm$^2$. In addition, the range of the integrated concentration may be satisfied only the n field stop layer 23 which comes into contact with the p collector layer 28. In this case, phosphorus may be introduced to form the n field stop layer 23 or protons H+ may be introduced to form the n field stop layer 23. When the range of the integrated concentration is satisfied in all of the three n-type layers; holes, which are minority carriers, are smoothly injected from the p collector layer when the gate is turned on, and the breakdown voltage can be stability obtained.

In the case of the IGBT, the operation and effect of the structure in which a plurality of broad buffer regions are provided are basically the same as those of the diode according to the second embodiment. That is, when the variation rate of the donor concentration of an FZ bulk wafer is ±α (α>0), the rate of the total length of a bulk portion other than the broad buffer region is γ, and the ratio of electric field intensity ΔE which is reduced n times in the broad buffer regions with respect to a critical electric field intensity $E_C$ is η, a plurality of broad buffer regions are preferably formed so as to satisfy the condition of $4\alpha(\gamma/\eta)/\{(2-\alpha)(2+\alpha)\}<\alpha$. As described in the third embodiment, in the IGBT, in order to form the p collector layer 28 on the rear surface, minority carriers are injected into the rear surface. Therefore, it is preferable that a charge neutral region which is not depleted be ensured in the range of 5 μm to 20 μm from the rear surface. It is preferable that the peak of the net doping concentration distribution of the broad buffer regions 26 be provided so as to lean to a collector electrode 25 from the depth of the center of the n− drift layer 21 to reliably prevent a depletion layer, thereby ensuring the above-mentioned charge neural region. That is, when a plurality of broad buffer regions 26 are formed so as to lean to the collector electrode from the center of the drift layer, a "reduction" ΔE (see FIG. 14(c)) in electric field intensity can occur in the same region, which is preferable. Specifically, the number of broad buffer regions close to the collector electrode from the middle position of the drift layer may be more than the number of broad buffer regions (including zero) close to the emitter electrode from the middle position.

In the fourth embodiment, when a plurality of broad buffer regions 26 are formed, it is preferable to irradiate the rear surface (the side on which the p collector layer 28 is formed) of the FZ wafer 10 with the proton H+. The reason is that, when the front surface of the wafer is irradiated, a crystal defect occurs in the interface between the gate oxide film and silicon and is likely to affect the voltage characteristics of the gate. In addition, when a trapping level remains in the vicinity of the p base layer 22, a carrier distribution is changed in an on state and the trade-off characteristics between an on-state voltage and turn-off loss are likely to deteriorate.

As described above, according to the fourth embodiment, it is possible to obtain the same effect as that of the first to third embodiments.

The n-type field stop layer has been described in the IGBTs according to the third and fourth embodiments. However, the n-type field stop layer can be applied to the diodes according to the first and second embodiments. That is, the n field stop layer may be formed between an n+ cathode layer 3 and the n⁻ drift layer 1 by the injection of phosphorus or irradiation with the proton H⁺ such that it has an impurity concentration less than that of the n+ cathode layer 3 and is adjacent to the n+ cathode layer 3.

As described above, according to the invention, it is possible to achieve a diode or an IGBT which has a small breakdown voltage variation width, a turn-off loss significantly less than that of the product according to the related art, and soft switching characteristics with an accurate control process. Therefore, it is possible to provide an IGBT module or an Intelligent Power Module (IPM) which has low electric loss and considers an environmental problem. In addition, in a power conversion device, such as a PWM inverter using an IGBT module with the above-mentioned characteristics, it is possible to prevent the occurrence of overvoltage breakdown or EMI and reduce calorific loss. For example, there are the following power conversion devices. A converter-inverter circuit can control, for example, an induction motor or a servo motor with high efficiency and is widely used in the industry or electronic railroad. A power factor improvement circuit (PFC circuit) controls an AC input current in a sine wave shape to improve the waveform and is used in a switching power supply. In addition, when a p-type isolation layer is formed in the cross section of the IGBT chip according to the invention to form a reverse blocking IGBT, the reverse blocking IGBT can be used in a matrix converter. Since the matrix converter does not require a DC link capacitor, it can be used in apparatuses requiring a small conversion device, such as elevators. When the invention is applied to the reverse blocking IGBT, the n field stop layer is configured to have an impurity concentration less than the concentration (for example, $2 \times 10^{16}$ atoms/cm³) in the third embodiment or it is skipped, and the concentration of one or a plurality of broad buffer regions are adjusted such that the depletion layer in a forward blocking state does not reach the p collector layer. According to this structure, when the depletion layer is expanded from the pn junction between the p collector layer and the drift layer in a reverse blocking state, it is possible to prevent the concentration of the electric field intensity of the pn junction and maintain both the reverse breakdown voltage and the forward breakdown voltage in the same order.

INDUSTRIAL APPLICABILITY

As described above, the semiconductor device and the method of manufacturing the semiconductor device according to the invention are useful for a power semiconductor device used in, for example, a power conversion device, such as a converter or an inverter.

EXPLANATIONS OF LETTERS OR NUMERALS 1, 21 n⁻ DRIFT LAYER
2 p ANODE LAYER
3 n⁺ CATHODE LAYER
4 ANODE ELECTRODE
5 CATHODE ELECTRODE
6, 26 BROAD BUFFER REGION
10 FZ WAFER
11 PROTON H⁺
12 INSULATING FILM
13 CRYSTAL DEFECT
14 BORON⁺
15 PHOSPHORUS⁺
22 P BASE LAYER
23 n FIELD STOP LAYER
24 EMITTER ELECTRODE
25 COLLECTOR ELECTRODE
27 GATE ELECTRODE
28 p COLLECTOR LAYER
29 n EMITTER LAYER
30 GRINDING AND WET ETCHING
31 GATE INSULATING FILM
32 INTERLAYER INSULATING FILM

The invention claimed is:

1. A semiconductor device comprising:
a first first-conductivity-type semiconductor layer;
a second second-conductivity-type semiconductor layer that is provided on one main surface of the first semiconductor layer and has an impurity concentration more than that of the first semiconductor layer;
a third first-conductivity-type semiconductor layer that is provided on the other main surface of the first semiconductor layer and has an impurity concentration more than that of the first semiconductor layer; and
a first-conductivity-type broad buffer region that is provided in the first semiconductor layer and has an impurity concentration more than that of the first semiconductor layer and in which a local maximum value of an impurity concentration distribution is less than the impurity concentration of the second semiconductor layer and the third semiconductor layer,
wherein the total amount of the net doping concentration of the broad buffer region is equal to or more than $4.8 \times 10^{11}$ atoms/cm² and equal to or less than $1.0 \times 10^{12}$ atoms/cm², and
wherein the resistivity $\rho_0$ ($\Omega$cm) of the first semiconductor layer satisfies $0.12V_0 \leq \rho_0 \leq 0.25V_0$ with respect to a rated voltage $V_0$ (V).

2. The semiconductor device according to claim 1,
wherein the total amount of the net doping concentration of the broad buffer region is equal to or more than $5.2 \times 10^{11}$ atoms/cm² and equal to or less than $1.0 \times 10^{12}$ atoms/cm², and
wherein the resistivity $\rho_0$ of the first semiconductor layer satisfies $0.133V_0 \leq \rho_0 \leq 0.25V_0$ with respect to the rated voltage $V_0$ (V).

3. The semiconductor device according to claim 1,
wherein a plurality of broad buffer regions are provided in the first semiconductor layer.

4. The semiconductor device according to claim 3,
wherein a ratio $\gamma$ of the sum of the widths of the plurality of broad buffer regions to the width of the first semiconductor layer, a ratio $\eta$ of the sum of reductions in the electric field intensities of the plurality of broad buffer regions to a critical electric field intensity when an reverse-bias voltage with the same level as a breakdown voltage is applied, and a deviation ratio a of a measured value to a standard value of the donor concentration of a substrate that is to form the first semiconductor layer satisfies $4\alpha(\gamma/\eta)/[(2-\alpha)(2+\alpha)] < \alpha$.

5. The semiconductor device according to any one of claims 1 to 4,
wherein the first semiconductor layer is an FZ silicon substrate.

6. A semiconductor device comprising:
a first-conductivity-type drift layer;
a second-conductivity-type base layer that is provided on a first main surface of the drift layer and has an impurity concentration more than that of the drift layer;
a first-conductivity-type emitter layer that is provided on the first main surface of the drift layer so as to come into contact with the base layer and has an impurity concentration more than that of the base layer;
an insulating film that comes into contact with the drift layer, the base layer, and the emitter layer;
a gate electrode that is adjacent to the drift layer, the base layer, and the emitter layer through the insulating film;
a second-conductivity-type collector layer that is provided on a second main surface of the drift layer and has an impurity concentration more than that of the drift layer; and
a first-conductivity-type broad buffer region that is provided in the drift layer and has an impurity concentration more than that of the drift layer and in which a local maximum value of an impurity concentration distribution is less than the base layer and the collector layer,
wherein the total amount of the net doping concentration of the broad buffer region is equal to or more than $4.8 \times 10^{11}$ atoms/cm$^2$ and equal to or less than $1.0 \times 10^{12}$ atoms/cm$^2$, and
wherein the resistivity $\rho_0$ ($\Omega$cm) of the drift layer satisfies $0.12V_0 \leq \rho_0 \leq 0.25V_0$ with respect to a rated voltage $V_0$ (V).

7. The semiconductor device according to claim 6,
wherein the total amount of the net doping concentration of the broad buffer region is equal to or more than $5.2 \times 10^{11}$ atoms/cm$^2$ and equal to or less than $1.0 \times 10^{12}$ atoms/cm$^2$, and
wherein the resistivity $\rho_0$ of the drift layer satisfies $0.133V_0 \leq \rho_0 \leq 0.25V_0$ with respect to the rated voltage $V_0$ (V).

8. The semiconductor device according to claim 6,
wherein a plurality of broad buffer regions are provided in the drift layer.

9. The semiconductor device according to claim 8,
wherein a ratio γ of the sum of the widths of the plurality of broad buffer regions to the width of the drift layer, a ratio η of the sum of reductions in the electric field intensities of the plurality of broad buffer regions to a critical electric field intensity when a voltage with the same level as a breakdown voltage is applied, and a deviation ratio a of a measured value to a standard value of the donor concentration of a substrate that is to form the drift layer satisfies $4\alpha(\gamma/\eta)/[(2-\alpha)(2+\alpha)] < \alpha$.

10. The semiconductor device according to any one of claims 6 to 9, further comprising:
a first-conductivity-type field stop layer that comes into contact with the drift layer or the broad buffer region on the first main surface of the substrate and comes into contact with the collector layer on the second main surface.

11. The semiconductor device according to any one of claims 6 to 9, further comprising:
a first-conductivity-type field stop layer that comes into contact with the drift layer or the broad buffer region on the first main surface of the substrate and comes into contact with the collector layer on the second main surface,
wherein the total amount of the net doping concentration of the drift layer, the broad buffer region, and the field stop layer is equal to or more than $1.2 \times 10^{12}$ atoms/cm$^2$ and equal to or less than $2.0 \times 10^{12}$ atoms/cm$^2$.

12. The semiconductor device according to any one of claims 6 to 9,
wherein the drift layer is an FZ silicon substrate.

13. A method of manufacturing a semiconductor device including a first first-conductivity-type semiconductor layer, a second second-conductivity-type semiconductor layer that is provided on one main surface of the first semiconductor layer and has an impurity concentration more than that of the first semiconductor layer, a third first-conductivity-type semiconductor layer that is provided on the other main surface of the first semiconductor layer and has an impurity concentration more than that of the first semiconductor layer, and a first-conductivity-type broad buffer region that is provided in the first semiconductor layer and has an impurity concentration more than that of the first semiconductor layer and in which a local maximum value of an impurity concentration distribution is less than the impurity concentration of the second semiconductor layer and the third semiconductor layer, comprising:
a first forming step of forming the second semiconductor layer on the one main surface of the first semiconductor layer; and
a second forming step of irradiating the second semiconductor layer on the first semiconductor layer with a hydrogen ion at a projected range to the first semiconductor layer and performing a heat treatment at a temperature of 300° C. or more to 550° C. or less, thereby forming the broad buffer region in the first semiconductor layer,
wherein, in the second forming step, the broad buffer region having a total net doping concentration of $4.8 \times 10^{11}$ atoms/cm$^2$ or more to $1.0 \times 10^{12}$ atoms/cm$^2$ or less is formed in the first semiconductor layer, and
wherein the resistivity $\rho_0$ of the first semiconductor layer satisfies $0.12V_0 \leq \rho_0 \leq 0.25V_0$ with respect to a rated voltage $V_0$ (V).

14. The method of manufacturing a semiconductor device according to claim 13, further comprising:
an introducing step of performing a heat treatment at a temperature of 1000° C. or more in an oxidizing atmosphere to introduce oxygen into the first semiconductor layer before the first forming step.

15. The method of manufacturing a semiconductor device according to claim 14,
wherein, in the introducing step, the oxygen is introduced at a concentration of $1 \times 10^{16}$ atoms/cm$^3$ or more into the first semiconductor layer.

16. A method of manufacturing a semiconductor device including a first first-conductivity-type semiconductor layer, a second second-conductivity-type semiconductor layer that is provided on one main surface of the first semiconductor layer and has an impurity concentration more than that of the first semiconductor layer, a third first-conductivity-type semiconductor layer that is provided on the other main surface of the first semiconductor layer and has an impurity concentration more than that of the first semiconductor layer, and a first-conductivity-type broad buffer region that is provided in the first semiconductor layer and has an impurity concentration more than that of the first semiconductor layer and in which a local maximum value of an impurity concentration distribution is less than the impurity concentration of the second semiconductor layer and the third semiconductor layer, comprising:

a second forming step of irradiating the other main surface of the first semiconductor layer with a hydrogen ion at a projected range to a portion of the first semiconductor layer deeper than a position where the third semiconductor layer is to be formed by a subsequent step and performing a heat treatment at a temperature of 300° C. or more to 550° C. or less, thereby forming the broad buffer region in the first semiconductor layer, wherein, in the second forming step, the broad buffer region having a total net doping concentration of $4.8 \times 10^{11}$ atoms/cm$^2$ or more to $1.0 \times 10^{12}$ atoms/cm$^2$ or less is formed in the first semiconductor layer, and the resistivity $\rho_0$ of the first semiconductor layer satisfies $0.12V_0 \leq \rho_0 \leq 0.25V_0$ with respect to a rated voltage $V_0$ (V).

17. The method of manufacturing a semiconductor device according to claim 16, further comprising:

an introducing step of performing a heat treatment at a temperature of 1000° C. or more in an oxidizing atmosphere to introduce oxygen into the first semiconductor layer before the second forming step.

18. The method of manufacturing a semiconductor device according to claim 17, wherein, in the introducing step, the oxygen is introduced at a concentration of $1 \times 10^{16}$ atoms/cm$^3$ or more into the first semiconductor layer.

19. The method of manufacturing a semiconductor device according to any one of claims 13 to 18, wherein, in the second forming step, a hydrogen-induced donor is formed by the irradiation with the hydrogen ion, thereby forming the broad buffer region.

20. The method of manufacturing a semiconductor device according to any one of claims 13 to 18, wherein the first semiconductor layer is an FZ silicon substrate.

* * * * *